United States Patent
Blohowiak et al.

[11] Patent Number: 5,958,578
[45] Date of Patent: *Sep. 28, 1999

[54] HYBRID LAMINATE HAVING IMPROVED METAL-TO-RESIN ADHESION

[75] Inventors: Kay Y. Blohowiak, Issaquah; Joseph H. Osborne, Tacoma; Kenneth A. Krienke, Seattle, all of Wash.

[73] Assignee: The Boeing Company, Seattle, Wash.

[*] Notice: This patent issued on a continued prosecution application filed under 37 CFR 1.53(d), and is subject to the twenty year patent term provisions of 35 U.S.C. 154(a)(2).

[21] Appl. No.: 08/742,171

[22] Filed: Nov. 4, 1996

[51] Int. Cl.⁶ .................. B32B 15/08; B32B 15/14
[52] U.S. Cl. .................. 428/336; 428/413; 428/416; 428/448; 428/450
[58] Field of Search .................. 428/448, 450, 428/413, 416, 417, 336, 335

[56] References Cited

U.S. PATENT DOCUMENTS

| | | | |
|---|---|---|---|
| 3,935,349 | 1/1976 | Terai et al. | 427/409 |
| 4,118,540 | 10/1978 | Amort et al. | 428/447 |
| 4,731,264 | 3/1988 | Lin et al. | 427/387 |
| 4,753,827 | 6/1988 | Yoldas et al. | 427/387 |
| 4,754,012 | 6/1988 | Yoldas et al. | 528/10 |
| 5,108,793 | 4/1992 | van Ooij et al. | 427/327 |
| 5,110,863 | 5/1992 | Sugama | 524/767 |
| 5,139,601 | 8/1992 | Holmes-Farley et al. | 156/329 |
| 5,182,143 | 1/1993 | Holmes-Farley et al. | 427/409 |
| 5,200,237 | 4/1993 | Sugama | 427/380 |
| 5,242,714 | 9/1993 | Steele et al. | 427/379 |
| 5,292,549 | 3/1994 | van Ooij et al. | 427/156 |
| 5,316,855 | 5/1994 | Wang et al. | 428/447 |
| 5,322,713 | 6/1994 | van Ooij et al. | 427/327 |
| 5,326,594 | 7/1994 | Sabata et al. | 427/327 |
| 5,443,976 | 8/1995 | van Ooij et al. | 427/327 |

*Primary Examiner*—D. S. Nakarani
*Attorney, Agent, or Firm*—John C. Hammar

[57] ABSTRACT

A surface treatment, especially for titanium and aluminum alloys, forms a sol-gel film covalently bonded on the metal surface to produce strong, durable adhesive bonds between the metal and an organic adhesive without using toxic chemicals and while significantly reducing or eliminating rinse water requirements of traditional anodizing or etching processes. An aqueous sol containing an zirconium and an organosilane with an organic acid catalyst and alkoxyzirconium stabilizer is applied to etched or grit blasted substrates by dipping, spraying, or drenching, to produce bonds in a single application comparable in strength and performance to standard anodize controls. Parameters affecting performance include the sol composition, the Si/Zr ratio, the ratio of sol ingredients, the concentration of the sol, the carrier solvent, solution age, catalysts, surface pretreatment, application method, curing process, and primer used.

26 Claims, 8 Drawing Sheets

HYBRID LAMINATE HAVING IMPROVED METAL-TO-RESIN ADHESION

TECHNICAL FIELD

A sol-gel surface coating of the present invention is applied to metal, especially through a waterborne reactive sol, to provide a stable oxide surface that results in corrosion resistance and enhanced organic matrix resin adhesion with the goal of achieving adhesion equivalent to conventional wet-chemical surface treatment methods.

BACKGROUND OF THE INVENTION

Conversion coatings for titanium, aluminum, or other metals are electrolytic or chemical films that promote adhesion between the metal and an organic adhesive resin, especially for adhesive bonding. Anodizing is a conventional process for making electrolytic films by immersing titanium or its alloys in chromic acid or an alkaline earth hydroxide or aluminum in chromic, sulfuric, or phosphoric acid. Anodizing produces a porous, microrough surface into which primer (a dilute solution of adhesive) can penetrate. Adhesion results primarily from mechanical interlocking between the rough surface and the primer. Chemical films include either a phosphate-fluoride conversion coating or films made with alkaline peroxide or other alkaline etchants for titanium substrates and alodyne films for aluminum substrates.

Using strong acids or strong bases and toxic materials (such as chromates) in immersion tanks, these surface treatment processes are disadvantageous from an environmental viewpoint. They require significant amounts of water to rinse excess process solutions from the treated parts. The rinse water and spent process solutions must be treated to remove dissolved metals prior to their discharge or reuse. Removing the metals generates additional hazardous wastes that are challenging to cleanup and dispose. They greatly increase the cost of using the conventional wet-chemical processes. A process that will produce adhesive bonds with equivalent strength and environmental durability to these standard processes without generating significant hazardous wastes while eliminating the use of hazardous or toxic materials would greatly enhance the state-of-the-art. The present invention is one such process. In addition, the process of the present invention can be applied by spraying rather than by immersion. It, therefore, is more readily used for field repair and maintenance.

Surface anodizing chemically modifies the surface of a metal to provide a controlled oxide surface morphology favorable to receive additional protective coatings, such as primers and finish paints. The surface oxides function as adhesion coupling agents for holding the paint lacquer, an organic adhesive, or an organic matrix resin, depending on the application. Anodizing improves adhesion between bonded metals. It also improves adhesion between the metal and a fiber-reinforced composite in hybrid laminates, like those described in U.S. Pat. No. 4,489,123 or U.S. Pat. No. 5,866,272. We incorporate this patent and patent application by reference. Structural hybrid laminates have strengths comparable to monolithic metal, and have better overall properties than the metal because of the composite layers. At higher temperatures (like those anticipated for extended supersonic flight), conventional anodized treatments are inadequate in addition to being environmentally unfriendly. The thick oxide layers that anodizing produces become unstable at elevated temperatures. The oxide layer dissolves into the base metal to produce surface suboxides and an unstable interfacial layer.

Obtaining the proper interface for the organic resin at the surface of the metal is an area of concern that has been the focus of considerable research. For example, cobalt-based surface treatments are described in U.S. Pat. Nos. 5,298,092; 5,378,293; 5,411,606; 5,415,687; 5,468,307; 5,472,524; 5,487,949; and 5,551,994. U.S. Pat. No. 4,894,127 describes boric acid-sulfuric acid anodizing of aluminum.

Standard surface treatments yield a surface that lacks many sites that are friendly with the bonding sites traditionally available in the binder. Such bonding sites bind through covalent bonds, hydrogen bonds, or van der Waals forces. A coupling agent for the resin and metal often is required to improve adhesion. The present invention improves adhesion by creating a sol-gel film at the interface between the metal and resin. A metal-to-resin gradient occurs through a monolayer of organometallic coupling agents. Generally we use a mixture of coupling agents. The organometallic compounds preferably have zirconium or silicon active moieties to interact with, react with, or bond to the metal surface. Some mechanical interaction may result from the surface porosity and microstructure. The organic portion of the organometallic compounds usually has a reactive functional group for covalently bonding with the adhesive or matrix resin. A preferred sol-gel film is made from a sol having a mixture of organometallic coupling agents. One component (usually containing the zirconium) bonds covalently with the metal while a second component bonds with the resin. Thus, the sol-gel process orients the sol coating having a metal-to-resin gradient on the surface.

Situations involving extended exposure to hot/wet conditions where polyimide adhesives hold promise do not allow the adhesion surface preparation to continue to be the standard anodize processes or oxide surface preparations, especially for titanium. At high temperatures, the solubility of oxygen in titanium is high and the oxide layer simply dissolves with the oxygen permeating through the base metal. The result is interfacial failure at the metal-adhesive interface. To alleviate this type of bond failure, the surface oxygen needs to be tied up in a stronger bond that will not dissociate in bonding or during operation of the system. A zirconate-silicate sol coating of the present invention is useful at these extended hot/wet conditions because the Zr—O bond that forms between the coating and the metal surface is stronger than a Ti—O bond. Both Zr—O and Ti—O bonds are stronger than Si—O bonds. The higher bond strength prevents dissolution of the oxide layer, so the Zr component in our sol coating functions as an oxygen diffusion barrier. We can use yttrium, cerium, or lanthanum in addition to or as a replacement for the Zr, because these elements also produce high strength oxide bonds that function as an oxygen diffusion barrier. The high cost of these compounds, however, dictates that they be used sparingly. Hence, we have developed a hybrid coating having Zr and Si to produce the desired metal-to-resin gradient needed for good adhesion in structural adhesive bonds, hybrid laminates, or paint adhesion applications. The hybrid coating integrates the oxygen diffusion barrier function of the Zr (or its alternatives) with an organosilicate network desirable for superior bonding performance.

SUMMARY OF THE INVENTION

The present invention is a surface treatment for metal surfaces, especially aluminum or titanium alloys, using a sol-gel film to produce a metal surface coating suitable as an interface to improve adhesion between the metal and an organic matrix resin or adhesive. The sol-gel film or sol coating provides corrosion resistance to a limited degree and promotes adhesion through a hybrid organometallic coupling agent at the metal surface. We use a sol to produce the sol-gel film on the metal's surface. The sol is preferably a dilute solution of a stabilized alkoxyzirconium organometallic salt, such as tetra-i-propoxy-zirconium or tetra-n-propoxyzirconium, and an organosilane coupling agent, such as 3-glycidoxypropyltrimethoxysilane for epoxy or polyurethane systems or a corresponding primary amine for polyimide systems, with an acetic acid catalyst for aqueous formulations. The sol-gel film is applied by immersing, spraying, or drenching the metal in or with the sol without rinsing. Key to the sol-gel film are bonding sites with the metal and separate sites to bond (or otherwise affiliate) with the resin. The sol-gel film produces a gradient changing from the characteristics of metal to those of organic resins. Good adhesion results from clean, active metal surfaces with sol coatings that contain the organometallic coupling agents in the proper orientation. After application, the sol coating is dried at ambient temperature or, more commonly, heated to a temperature between ambient and 250° F. to complete the sol-gel film formation.

Ideally, covalent bonding occurs between the metal surface and a zirconium compound in the sol. Successful bonding requires a clean and chemically active metal surface. The strength and durability of the sol coating depends upon chemical and micro-mechanical interactions at the surface involving, for example, the metal's porosity and microstructure and on the susceptibility of the sol coating to rehydrate. Our preferred sol coating provides high temperature surface stability for paint adhesion, adhesive bonding, or fabrication of structurally superior hybrid laminates.

A preferred adhesively bonded assembly includes at least two parts aligned to define a bond line with a sol-gel film on the face of each part in registration with a bond line defined by the parts. The film has a mixture of an organozirconium and organosilane. The organosilane includes a reactive organic functionality. The organozirconium is stabilized with an effective amount of an organic acid to reduce the rate of hydrolysis of the organozirconium while catalyzing the organosilane. The organozirconium and the organosilane are present in the ratio of about 1 part organozirconium to about 2.0–3.4 parts organosilane by volume. An adhesive connects the parts along the bond line while interfacing with the sol-gel film. The adhesive has a reactive functionality for covalently bonding with the reactive functionality of the organosilane. The preferred organosilane is 3-glycidoxypropyltrimethoxysilane or 3-aminopropyltrimethoxysilane, while the preferred organozirconium is tetra-n-propoxyzirconium.

In one aspect, the present invention relates to a hybrid laminate that includes a sol-coated metal and fiber-reinforced organic matrix resin adhered to the sol-coated metal. The sol provides a stable oxide surface on the metal for corrosion resistance and adhesion enhancement. Preferably, the sol-coated metal is made with a sol that includes an organosilane and an organozirconium. The organosilane typically includes a functional organic moiety for covalently bonding to the matrix resin.

DETAILED DESCRIPTION OF THE INVENTION

Figure 1:
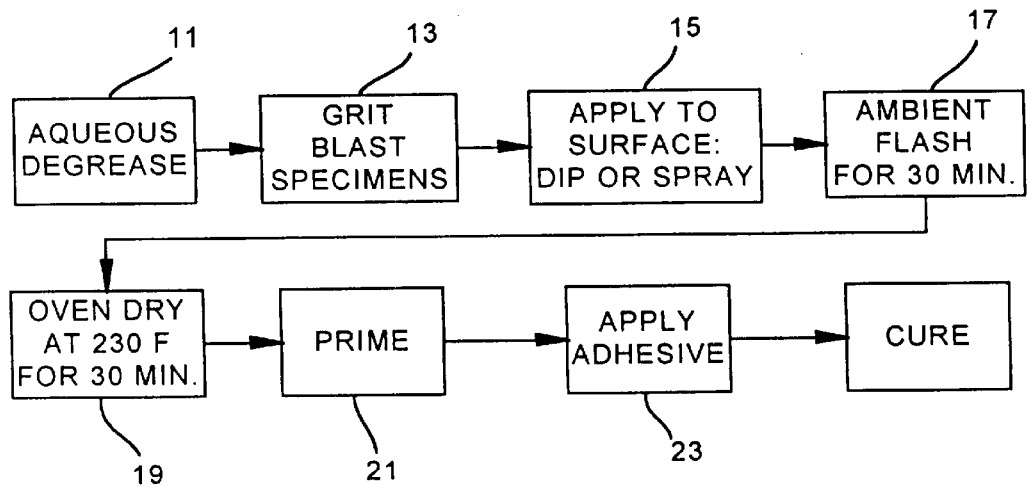
FIG. 1 is a block diagram of the typical steps in the surface treatment process of the present invention.

In describing the invention, we will first discuss some generally applicable aspects of the sol and of the sol coating. Then, we will discuss representative tests we conducted for sol coatings on titanium for forming strengthened adhesive bonds using an epoxy adhesive. Finally, we will discuss our preferred applications for the sol coating in hybrid laminates and in adhering paint to metal.

1. The Sol Coating

Sol coating of metals achieves resin-to-substrate bonding via chemical linkages (covalent bonds, hydrogen bonds, or van der Waals forces) while minimizing environmental impacts otherwise caused by the traditional use of highly diluted hazardous metals. A preferred sol for making the sol coating (also called a sol-gel film) on the metal includes an organozirconium compound (such as tetra-n-propoxyzirconium) to covalently bond to the metal through Zr and an organosilane (such as 3-glycidoxypropyltrimethoxysilane) to covalently bond to the organic primer, adhesive, or resin (with an acetic acid catalyst in water-based formulations as a catalyst and Zr hydrolysisrate stabilizer).

In a successful surface treatment, the typical failure mode for adhesively bonded specimens in a hot/wet environment is cohesive failure in the organic adhesive layer. In such cases, the sol-gel film is stronger than the bulk adhesive, so the adhesive bond is as strong as possible.

We use sol-gel chemistry to develop binder coatings about 20–500 nm thick that produce a gradient from the metallic surface through a hybrid organometallic sol-gel film to the adhesive. Bond strength and durability in our preferred sol coating is increased by including organosilanes and organozirconium compounds. The organosilanes covalently bond to or otherwise associate with the organic adhesive resin or primer. Ideally, covalent bonding also occurs at the interface between the sol-gel and metal surface. Mechanical interactions may also play a role depending on the design (i.e., porosity, microstructure) of the sol coating. Durability of the sol-gel film in humid conditions depends on whether the film rehydrates. If the films is too thick, it becomes glassy.

The term "sol-gel," a contraction of solution-gelation, refers to a series of reactions where a soluble metal species (typically a metal alkoxide or metal salt) hydrolyzes to form a metal hydroxide. The soluble metal species usually contain organic ligands tailored to correspond with the resin in the bonded structure. The metal hydroxides condense (peptize) in solution to form an hybrid organic/inorganic polymer. Depending on reaction conditions, the metal polymers may condense to colloidal particles or they may grow to form a network gel. The ratio of organics to inorganics in the polymer matrix is controlled to maximize performance for a particular application.

Many metals are known to undergo sol-gel reactions. Silicon and aluminum sol-gel systems have been studied extensively. Representative sol-gel hydrolysis and condensation reactions, using silicon as an example, are shown in equations (1) and (2).

$$Si(OEt)_4 + 2H_2O \Rightarrow Si(OH)_4 + 4EtOH \quad \text{hydrolysis} \quad (1)$$
$$Si(OH)_4 \Rightarrow SiO_2 + 2H_2O \quad \text{condensation} \quad (2)$$

wherein Et is $CH_3CH_2$—. The hydrolysis and condensation reactions can be complete, resulting in complete conversion into the metal oxide or a hydrous metal hydroxide. They can be partial, leaving more of the alkoxide functionalities in the finished gel. Depending upon the reaction conditions, reactions (1) and (2) can produce discrete oxide particulates, as demonstrated in the synthesis of nanoscale particles, or they can form a network gel, which can be exploited in film formation. The solubility of the resulting gel in a solvent will depend upon the size of the particles and degree of network formation.

We prefer a clean and chemically active metal surface to bond a sol-gel film from the sol by spraying, immersing, or drenching. Cleaning is a key factor toward obtaining good adhesion. If the surface is dirty, bonding is blocked by the dirt or occurs between the sol and the dirt rather than between the sol and the surface. Obtaining a chemically active surface is not trivial. Titanium produces a passive oxide surface. A bare, pure titanium surface will immediately oxidize in air or dry oxygen to form a barrier titanium oxide film which has a thickness of 2–4 nm (20–40 Å). Titanium surface oxides do not hydrolyze as readily as aluminum surface oxides to form active metal hydroxides. Water will, however, chemisorb onto the surface of the titanium oxide. Aluminum oxidizes as quickly, or more quickly in air.

$HNO_3$—HF etching of titanium alloys removes $TiO_2$ alpha case, but creates a smooth surface which is difficult to bond to. Traditional alkaline etches like TURCO 5578 or OAKITE 160, produce a roughened surface better suited for adhesive bonding, but produce a tenacious smut layer. The smut causes adhesion to be reduced dramatically. Extended soaking in hot $HNO_3$ after the alkaline etch still leaves some smut. In our preferred process, we clean and rinse the surface, etch with $HNO_3$—HF, rinse again, and alkaline etch. Again after another rinse, we desmut the surface with BOECLENE once or in multiple stages to produce a clean and active surface best suited for adhesive bonding through the sol coating of the present invention.

Our model of the formation of a sol-gel film on titanium involves Lewis acid/base interaction of a hydrolyzed zirconium alkoxide, an organosilane, or both in the sol with the titanium oxide surface. This interaction is possibly assisted by chemisorbed water to cause the formation of a coupled Zr—O—Ti or Si—O—Ti linkage and a new Ti—OH bond on the surface. A similar reaction occurs on aluminum. The ability of the metal alkoxides to covalently bond with the metal surface most likely requires more energy in the case of titanium than aluminum. Complete coupling and formation of covalent bonds with titanium alloys may not occur until the part reaches higher temperatures, such as they usually experience during adhesive curing.

Sol-gel chemistry is quite versatile. Reaction conditions (for example, concentration of reagents and catalyst type) control the relative rates of the hydrolysis and condensation reactions. Sol-gel solutions can be prepared which readily form thin films or which condense to fine colloidal particles. Starting materials and reaction conditions can produce films with morphology similar to surface coatings achieved with anodize and etch processes. Density, porosity, and microstructure can be tailored by controlling the chemistry of the sol.

Sol-gel condensation reactions are affected by the acid-base character of the metal/oxide surface. The isoelectronic point (IEP, a measure of surface pH) for titanium is more acidic (IEP=6.0) than an aluminum surface (IEP=9.2), which changes the surface chemistry of the metal with the sol.

2. Screening Studies on Sol Coatings

We conducted screening studies on test panels of titanium-6Al-4V (Ti-6-4) alloy sized 6"×6"×0.50" initially prepared by degreasing the surface with an aqueous detergent (11, FIG. 1). The panels were then either grit blasted with #180 grit alumina (13) followed by a final aqueous detergent cleaning to minimize the presence of loosely adhered grit or acid etched in a $HNO_3$—HF immersion tank (not shown in FIG. 1). Our preferred sol for these tests consisted of a dilute aqueous mixture of 3-glycidoxypropyltrimethoxysilane (GTMS) and tetra-n-propoxyzirconium (TPOZ) with an acetic acid catalyst. Typically, the panels were dip-coated with a 10 minute immersion time (15), held under ambient conditions for 15 to 30 minutes (17), and dried in a 230° F. oven for 15–30 minutes (19). With the sol coating complete the specimens were ready for accepting primer (21) and then an epoxy adhesive (23). We also tested corresponding formulations using alcohol as the carrier or solvent. These epoxy sols typically have a pH around 4–5.

Our test specimens were primed with BMS 5-89 chromated adhesive primer (American Cyanamid BR127). Two sol coated panels were then bonded together to form an adhesive lap joint in an autoclave using BMS 5-101 Type II Grade (Dexter-Hysol EA 9628) 250° F. cure epoxy adhesive.

Figure 2:
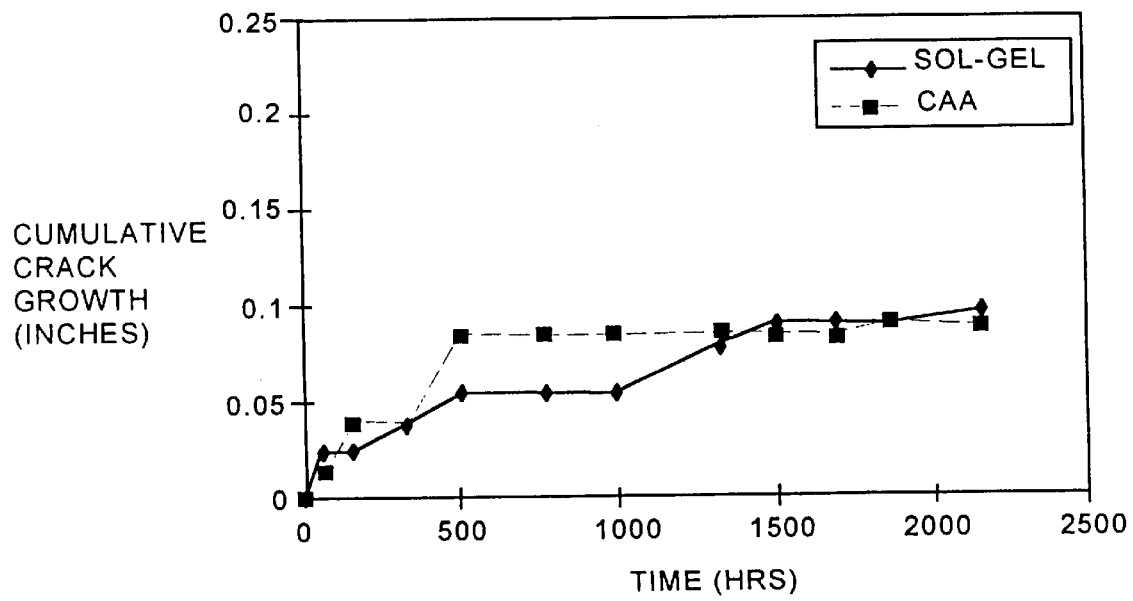
FIG. 2 is a graph showing wedge crack extension for a sol-coated titanium alloy of the present invention compared with a chromic acid anodize standard.
Figure 3:
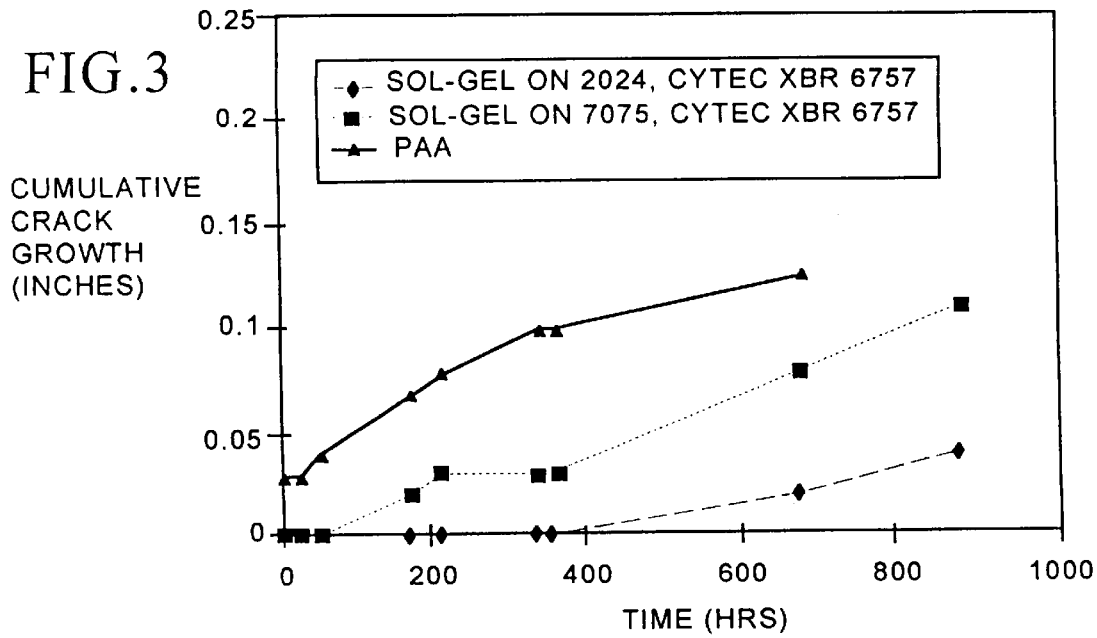
FIG. 3 is a graph showing wedge crack extension for a sol-coated aluminum alloy of the present invention compared with a phosphoric acid anodize standard.

Screening level testing used the ASTM D 3762 Wedge Test with exposure at 140° F. and greater than 95% relative humidity to test the bond strength. The bonded panels were cut into five 1"×6" strip specimens and wedges were driven into the bondline. Progress of the crack along the bondline was measured after the initial driving of the wedge, and after exposure to 140° F. and greater than 95% relative humidity for one hour, 24 hours, one week, and longer. Samples were monitored in the humidity chamber for over 2500 hours total exposure time. Typical test results compared with conventional chromic acid anodizing (CAA) are shown in FIG. 2. Test data for comparable aluminum specimens with 7075 or 2024 aluminum alloys are shown in FIG. 3. Here, the standard surface treatment for comparison was phosphoric acid anodizing (PAA).

Figure 4:
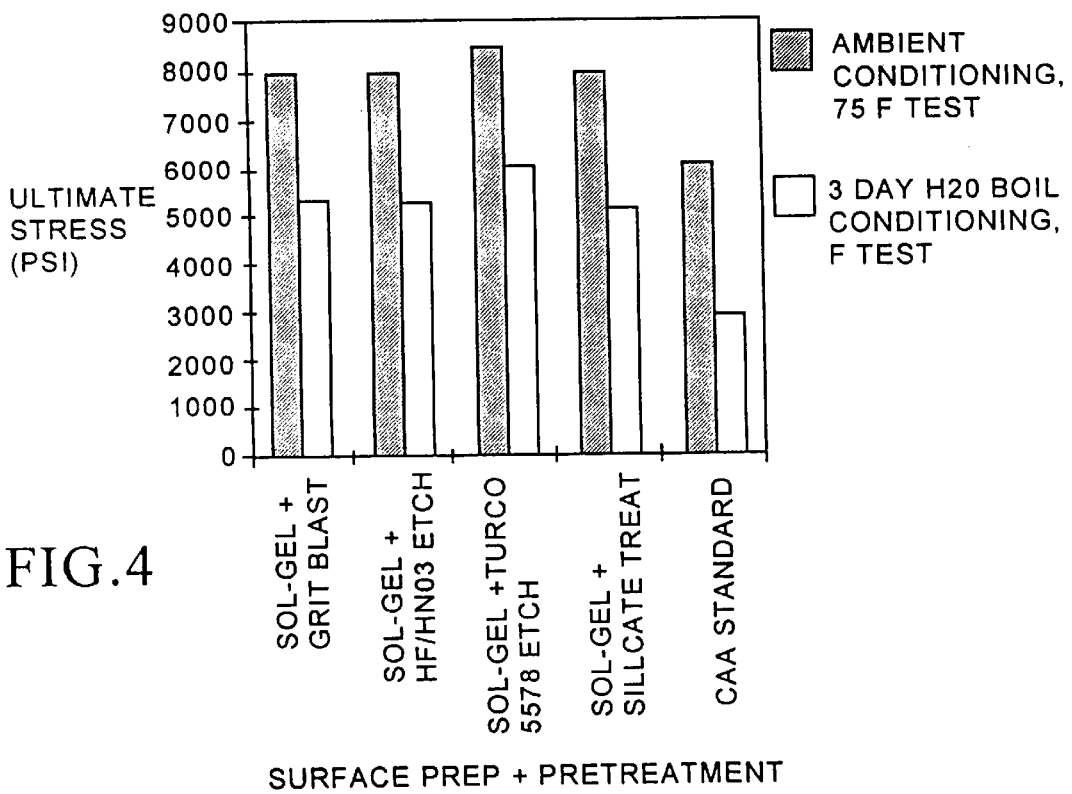
FIG. 4 is a chart showing lap shear ultimate stress test results for several coupons of titanium-6Al-4V alloy adhered with Cytec FM-5 polyimide adhesive.
Figure 5:
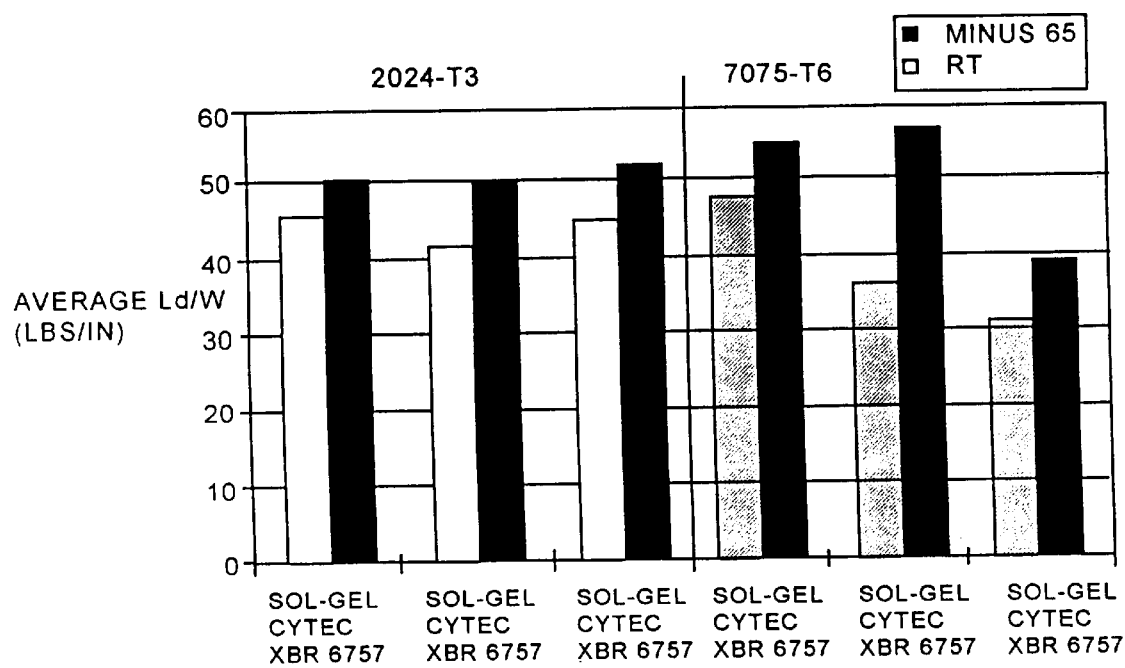
FIG. 5 is a chart showing floating roller peel resistance test results for sol-coated 2024 and 7075 aluminum alloys compared with phosphoric acid anodize standards.

FIG. 4 reports test results of the ultimate strength of Ti-6-4/FM-5 polyimide adhesive lap joints. FIG. 5 reports the average roller peel resistance of aluminum/epoxy specimens similar to those made for the crack growth tests reported in FIG. 3.

Additionally, lap shear testing was carried out on panels which showed good wedge crack screening characteristics. Finger panels were primed and lap bonded with the 5-101 adhesive. Measurements were taken at −65° F., room temperature, and 165° F.

A water-based system alleviates many of the flammability, safety, toxicity, and environmental concerns associated with the process when the sol is alcohol-based. We chose a glycidoxy-silane (an epoxy) because of its stability in solution and its ability to crosslink with common, aerospace epoxy or urethane (cyanate ester) adhesives. The silane is acid-base neutral (pH≈7.0) so its presence in the sol mixture does not increase the relative hydrolysis and condensation rates of the alkoxides. Sols including the organosilanes are relatively easy to prepare and to apply with reproducible results.

The choice of the organosilane coupling agent was a significant factor in improving hot/wet stability of the BMS epoxy bonding system. The GTMS included an active epoxy group which can react with the bond primer. GTMS did not form strong Lewis acid-base interactions with the hydrated titanium oxide substrate. The titanium oxide surface was more accessible to the zirconium organometallic when GTMS was used, allowing the desired stratification of the sol-gel film in essentially a monolayer with the epoxy groups of the silane coupling agents oriented toward the primer. The ideal concentration will depend upon the mode of application. A higher concentration may be preferred for drench or spray applications. We believe this orientation allowed strong covalent bonding to develop between the titanium substrate and zirconia and silica (i.e. M—O—M bonds), as well as maximizing bonding between the epoxy moiety of the GTMS to the epoxy adhesive.

For polyimides (including bismaleimides), we usually replace GTMS with an aminoalkylsilane or an aminoarylsilane to match the silane coupling chemistry with the resin system. In these sols which operate best at a pH 8–9, we add ammonium hydroxide in small amounts to disrupt the Zr-acetate complex that otherwise forms.

Physical size of the silane coupling agent also has an effect on adhesion. Aluminum studies revealed that both the initial adhesion and hydrolytic stability decreased when epoxycyclohexylpropyltrimethoxysilane was used instead of GTMS as the coupling agent. We attribute the difference in performance to a difference in size of the organic functionality. This size effect is most likely the result of physical interference of both hydrolysis and condensation reactions by the bulky alkyl group attached directly to the silicon. Hydrolysis was incomplete and the silicon hydroxide could not effectively condense with the aluminum surface. These results suggest that the most effective coupling agents for a spray or drench coating application will be smaller so as not to sterically hinder hydrolysis and condensation reactions.

The concentrations of the reactants in the sol were generally determined as volume percentages. In the screening tests, a 2 vol % of GTMS and 1 vol % of TPOZ was used. This concentration corresponds to a molar ratio of silicon to zirconium of 3.7:1. Related studies suggest that a slightly higher concentration of reactants, namely a total of (Si+Zr)= 4.4 volume % may yield better results, so the ratio of GTMS to TPOZ might need further adjustment to obtain the optimal performance (strongest surface adherence). We believe that a higher adhesion will occur with a mixed (Zr+Si) sol because of the more chemically active Zr. The sol might also include cerium, yttrium, titanium, or lanthanum organometallics, such as yttrium acetate trihydrate or other hydrates, yttrium 2-ethylhexanoate, i-proproxyyttrium, methoxyethoxyyttrium, yttrium nitrate, cerium acetate hydrate, cerium acetylacetonate hydrate, cerium 2-ethylhexanolate, i-propoxycerium, cerium stearate, cerium nitrate, lanthanum nitrate hexahydrate, lanthanum acetate hydrate, or lanthanum acetylacetonate, together with the Zr or in its place.

The organozirconium compound serves to minimize the diffusion of oxygen to the surface and to stabilize the metal-resin interface. As a variation to the sol coating process, a stabilizer might be applied to the surface to form a barrier film prior to applying the hybrid organometallic sol to form the sol-gel film.

Figure 6:
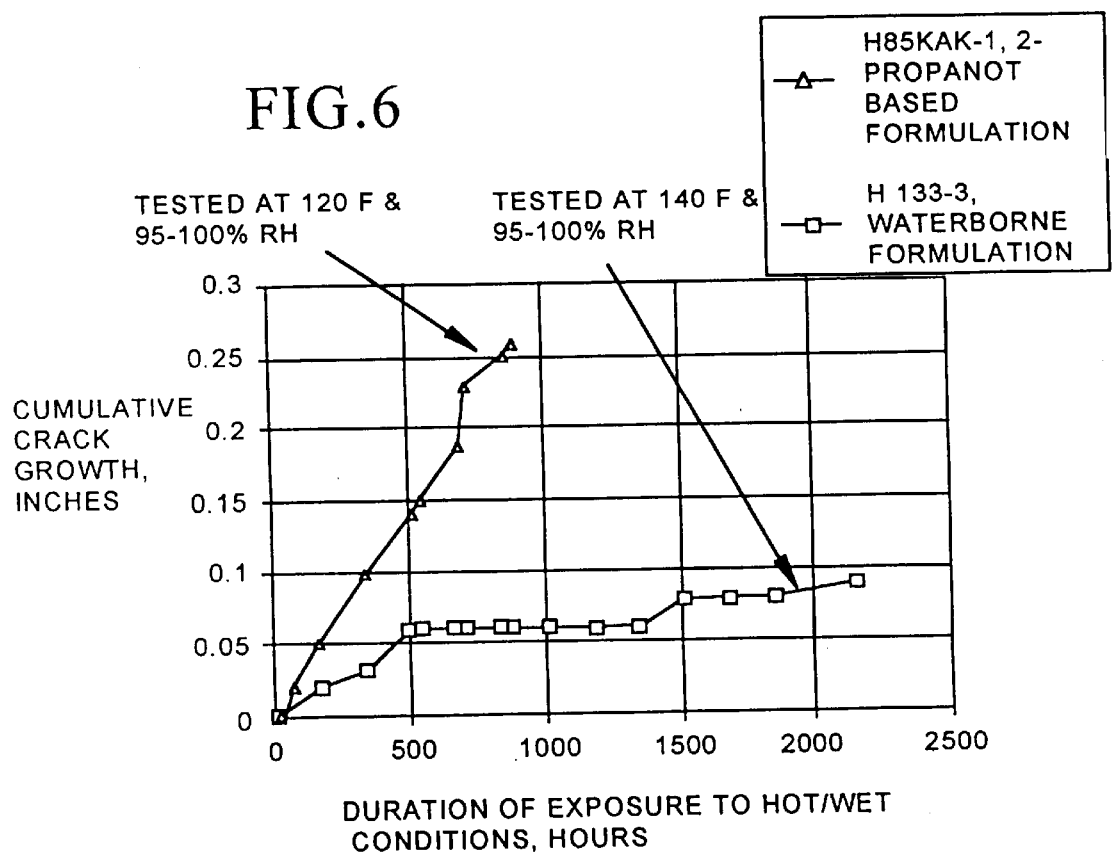
FIG. 6 is a graph showing cumulative crack growth of alcohol-based and water-based sol coatings on a titanium alloy as a function of the duration of exposure to hot/wet conditions.

Alcohol-based sols allow us to precisely control the amount of hydrolysis. Optimization of the water-based system, however, actually yielded better hot/wet durability results than the alcohol-based system, as demonstrated by comparing similar alcohol and water-based coatings (FIG. 6).

Aging of the sol which we call the "induction time" is another important factor in using our sols. Complete hydrolysis and condensation of the organometallic in the sol-gel film is important to develop a hydrolytically stable metal oxide film in the metal. The presence of hydrolyzable alkoxides in the sol-gel film will have two adverse effects. First, every residual alkoxide represents an incomplete condensation site between the metal and the coupling agents. Incomplete condensation, therefore, decreases the ultimate bond strength of the sol-gel film. Second, in a humid environment, these alkoxide residues can hydrolyze. The structural changes accompanying hydrolysis cause stress in the sol-gel film which, we believe, promotes failure to occur within the sol-gel film or at one of the interfaces (metal/film or film/primer or adhesive).

Aging is a function of the rates of the hydrolysis reaction of the zirconium alkoxides and the organosilane. Tetra-n-propoxyzirconium reacts more rapidly with water or other active hydrogens than the silane. The zirconate hydrolyzes rapidly using ambient moisture and condenses with itself or with absorbed water on the titanium surface. If not properly controlled, this zirconate hydrolysis self-condensation reaction can produce insoluble zirconium oxyhydroxides which will precipitate and become nonreactive.

If, however, the sol is applied too short a time after being made, the organosilane may not be fully hydrolyzed. As the sol ages, the hydrolyzed silicon and zirconium components may condense among themselves, forming oligomers and networks. These networks will eventually become visible to the naked eye and become insoluble. The ideal solution age is at the point that the zirconium and silicon are hydrolyzed sufficiently that zirconium and silicon react with the metal surface. At this point, generally some metal polymers and networks have formed in the sol and they will give the sol-gel film some structure.

We made the zirconium and silicon components hydrolyze on a similar time scale by mixing the zirconium alkoxide with glacial acetic acid to stabilize the fast reacting four-coordinate zirconate center and to enable a water-based system. This mixing effectively changed the geometric and electronic nature of the zirconium component. We use the minimum amount of acetic acid necessary to form the zirconium-acetic acid complex. Other organic acids, like citric acid, can be substituted for the acetic acid. We might also use glycols, ethoxyethanol, $H_2N$—$CH_2$—$CH_2$—$OH$, or the like.

Extended X-ray fine structure (EXAFS) analysis to interpret the X-ray absorption near edge structures (XANES) identified zirconium polymers in the sol where the terminal alkoxy groups are substituted by acetyl groups. Bridging alkoxide groups existed in an equilibrium placing the Zr-atom in a 6-fold coordination. The zirconium thereafter hydrolyzed more slowly, putting it on a hydrolysis time scale similar to the preferred organosilane. IR measurements indicated that the acetate coordination was monodentate.

The relative rates of the hydrolysis and condensation reactions involved in the sol coating process are controlled by the type of catalyst (either acid or base), the concentrations of the reagents in the reactions, the metal alkoxide selected, and the water available for hydrolysis. An acidic catalyst promotes the hydrolysis reaction over condensation while a basic catalyst does the opposite. We examined the effects of various acidic catalysts, such as acetic acid and nitric acid, and basic catalysts, such as ammonium hydroxide and triethylamine. For these formulations, the basic catalysts promoted the condensation reactions too vigorously, which shortened the pot-life of the solution. Colloidal zirconate-silicate particles precipitated too soon after the sol was mixed. The nitric acid was effective as a catalyst, but did not stabilize the zirconate via a coordinating ligand like the acetate ion in acetic acid, so aging of the sol produced differing, unpredictable results. Thus, acetic acid was chosen as the preferred catalyst. We make the sols dilute to control the self-condensation reactions, thereby extending the pot life. Still, the sols must be used soon after they are prepared.

The amount of acetic acid also plays a major role in the sol because the acetic acid functions as a catalyst for the hydrolysis and a hydrolysisrate stabilizer for the zirconium complex. In general throughout our screening tests, we added 0.13 moles of glacial acetic acid to 0.091 moles of the organosilane before combining the organosilane with the organozirconium. Doubling the amount of acetic acid to 0.26 moles improved bonding performance; tripling the amount of acid to 0.39 moles made it worse. More studies are necessary to understand this correlation completely, especially the relationship between the acetic acid concentration and the gelation rate. We try to minimize the amount of acetic acid. Less is best for application to corrosion sensitive airplane parts.

In our tests, we cleaned the metal surface using abrasive blasting or acid etching with $HNO_3$—HF in both liquid and paste form. Since the sol reacts directly with chemical moieties on the substrate surface, adhesion is sensitive to surface precleaning. Residues or smut resulting from the cleaning processes can drastically effect the adhesive bond performance, because residues and smut are relatively loosely adhered to the surface.

Figure 7:
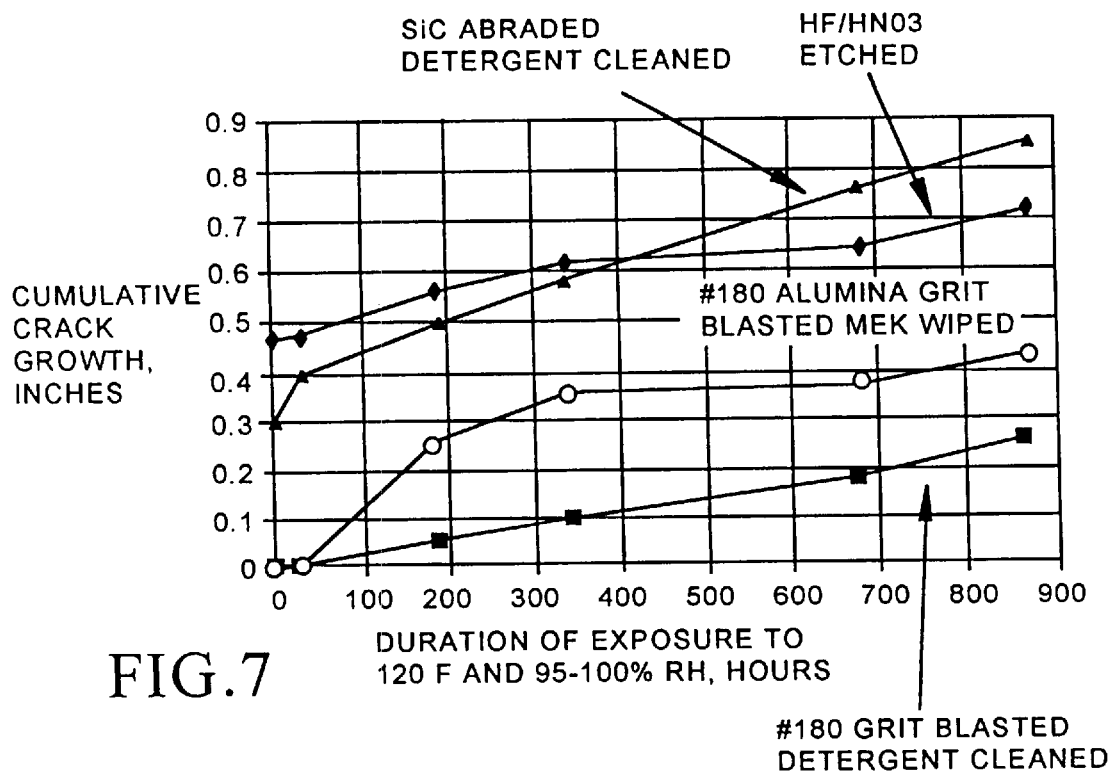
FIG. 7 is a graph showing the effect of surface cleaning and pretreatment by plotting cumulative crack growth against the duration of exposure to hot/wet conditions for samples with differing surface treatments.

FIG. 7 shows the wedge crack test results for Ti-6Al-4V panels given a variety of surface pretreatments and then coated with the same sol. Our results indicate that degreasing with an aqueous detergent with a gentle scrubbing action or agitation was sufficient for removing most soils and grease from the metal surface. Subsequent grit blasting was generally better than acid etching for pretreatment of the surface. We believe that grit blasting enhanced mechanical interaction by producing a macrorough surface. The grit blasted surface may hold the sol on the surface longer during the ambient temperature flash, allowing a longer reaction time between the sol and surface, but the time difference is rather short. Prehydrolysis of the surface using steamy or hot water may activate the metal by populating the surface with chemisorbed water. The water on the surface can turn into surface hydroxyls which are available for condensation with the sol. Surface hydroxyls are especially important for titanium alloys.

The two best performing sets of samples were both grit blasted with #180 alumina and had the roughest surfaces. Of these two grit blasted samples, the set which was cleaned with Alconox detergent following grit blasting had better performance than one wiped only with methyl ethyl ketone (MEK). Solvent wiping of the rough surfaces of grit blasted panels with lint free cloth frequently left small shreds or fiber residues snagged on the substrates. Cloth residues increased with higher pressure exerted on the wiping cloth.

Test results for panels etched for one minute in $HNO_3$—HF did not perform as well as the grit blasted panels. The poorest wedge crack test performance was obtained from panels abraded by hand with #80 and #150 grit silicon carbide sandpaper. The sandpaper produced a relatively non-uniform surface that typically was contaminated with silicon carbide. Detergent washing did not remove the contamination. Sanding does not produce the same mechanical surface as grit blasting.

A paste etch process was considered as an alternative to the $HNO_3$—HF add etch bath for field repair. The paste consists of nitric and hydrofluoric acid in an emulsifier. It was applied with a brush on the surface of the titanium panels. Four 6"×5" titanium panels were solvent wiped and prepared for the process. Hydrogen bubbles were produced on the surface of the metal during the process by the reaction of the acid and the metal surface. These bubbles became encapsulated in the paste. A continuous brushing motion over the surface of the panel was necessary to keep the etchant in contact with the titanium. Without brushing, the etching was uneven.

TURCO 5578 alkaline etch produces a mat finish, similar to an anodize, resulting from the formation of a microrough surface. This pretreatment shows superior hot/wet durability.

The use of conventional dry grit blasting as a surface preparation pretreatment prior to sol coating has both advantages and disadvantages depending on the type of metal surface to be treated and the environment in which the process is being carried out. Grit blasting produced the highest strength and most durable adhesive bonds of the tested surface treatments over the course of this program. Grit blasting should work well in practice on thicker panels or parts requiring limited amounts of blasting. Care must be taken not to warp the panel as the result of stresses introduced during the blasting.

There are numerous disadvantages associated with grit blasting. First, it cannot be used on titanium foil or honeycomb core without serious risk of damage to the substrate or on fatigue critical parts. Blasting produces holes in the metal in these cases. Complex parts might be difficult to access to produce a uniform finish. Although the equipment and materials required for grit blasting are not exotic, they may not be available at sites where sol coatings could otherwise easily be applied.

We blasted titanium panels with different grit sizes of alumina #46 grit, #180 grit, and a very fine polishing alumina with an average size of 50 micrometers. All of the grit sizes evenly abraded the surface and yielded a uniform matte finish. Surface roughness was measured using a surface profilometer, using a half inch traverse and a 0.03 cutoff. The average roughness (Ra) was 144 microinches for the #46 grit panel, 30 for the #180 grit panel, and 22 for the panel blasted with the fine grit. Surface contaminants, like heavy greases or oils, were not easily removed during grit blasting using the fine alumina powders. The grit was simply imbedded into the contaminant and lost all velocity. The finest alumina grit was too friable and broke down quickly during the blasting process. After a certain time period, the very fine particles were no longer effective at abrading the surface. The dust was hard to contain within the sandblasting apparatus.

We used scanning Auger microscopy to analyze the panels after blasting. The effective oxide thickness of the non-blasted area was measured at approximately 200 Å, while the total structured surface was about 2000 Å for that of the blasted area. Bright particles were observed imbedded into the surface and were verified to contain primarily aluminum and oxygen, most likely as $Al_2O_3$. Acid etching removed the embedded alumina particles from the titanium surface only after the titanium had been etched away and removed from around the particles. Unfortunately, post-blasting etching also removed the roughened texture of the surface. We do not know the role alumina particles play, if any, in adhesion to the grit blasted surface.

No single surface pretreatment appears to provide optimum results over the full range of substrates. Various combinations of acid etch and alkaline etch treatments apparently work well on certain alloys, but questions remain as to whether they introduce hydrogen embrittlement problems for Ti foil or honeycomb core substrates. Our preferred cleaning and activation processes are prewetting, steam cleaning, alkaline etching to activate the surface, and BOECLENE or other acid etching (i.e. $H_2SO_4$—$NHO_3$-ammonium bifluoride) to desmut titanium alloys.

Figure 8:
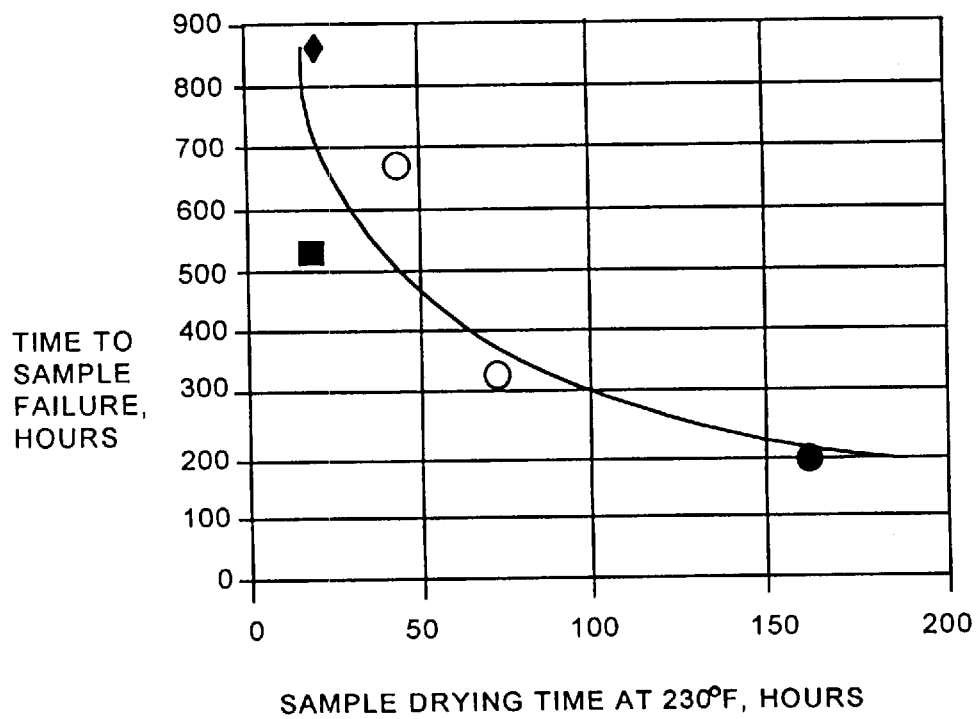
FIG. 8 is a graph showing the effect of drying time at 230° F. on the time to failure of wedge crack extension test samples.

The drying cycle for the sol coating is another significant processing parameter to controlling adhesive bond performance. The drying cycle includes: (1) ambient air flash time after application of the sol; (2) oven dry time at temperature; and (3) storage time in air thereafter prior to application of the primer. As shown in FIG. 8, shorter drying times at 230° F. tended to yield better results. An oven drying time of 15–30 minutes at 140–230° F. in air lead to better hot/wet durability.

Figure 9:
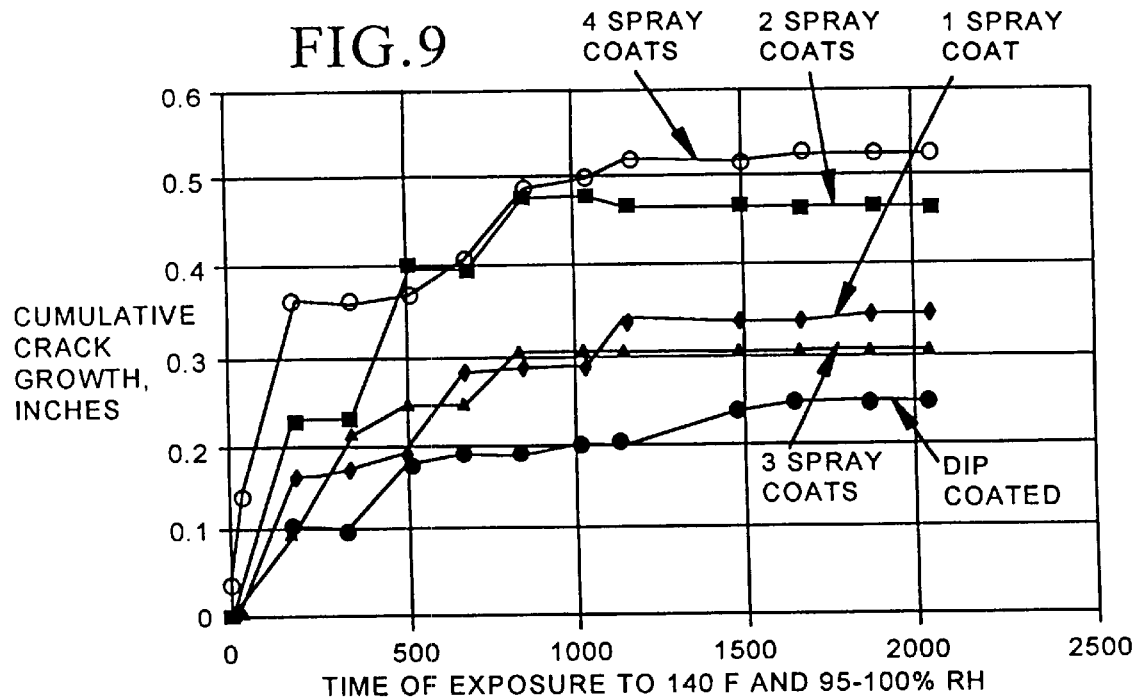
FIG. 9 is a graph showing the effect of spraying versus dipping (immersing) to apply the coating, plotting cumulative crack growth against the duration of exposure to hot/wet conditions.

FIG. 9 shows a difference we observed in performance arising from applying the sol by spraying or dipping. In this experiment, the sol was sprayed onto the substrates using a high velocity, low pressure (HVLP) spray gun. A coat consisted of light, but complete, coverage of the surface. The coating was allowed to flash dry between coats. In all cases, the sprayed coatings did not perform as well as the dipped coatings. Specimens sprayed with an even number of coats did not perform as well as specimens sprayed with an odd number of coats, this effect may be an artifact of how the gradient coating layered onto the surface. In applying an even number of coats, the GTMS may couple with the next layer's glycidoxy end of the GTMS in the next layer, the silica oriented away from the metal surface where it cannot bond with the metal and where it interferes with the sol-gel film/primer interfacial chemistry. Consequently, there would be fewer organic functionalities available for bonding to the resin. With an odd number of coats, a glycidoxy edge would occur at the outer surface if this intermediate reaction occurs. Hence, we suspect, we achieve better performance. This gradient effect has been seen in multilayers of phospholipids and in other biochemical systems.

We also examined a drench method for applying the sol, which combines elements of both the dip and spray processes. In this application technique, the surface of the part is wetted with a continuous stream of solution for a given period of time. The solution surface is wet with the solution for longer than in the spray process, but not as long as the dip process. One of the advantages of this technique is that it does not require the precise skills of an expert sprayer. It also uses significantly less solution than the dip (immersion) process. The coating thicknesses are controlled by the coating formulation itself and length of time that the surface is wet.

Our testing on epoxy systems was primarily conducted using solvent-based, chromated primer Cytec BR 127. We conducted tests with the nonchromated water-based Cytec XBR 6757 primer. The water-based primer with a preferred sol-gel formulation yielded comparable results to the solvent-based primer.

Titanium samples (Table 1) were aqueous degreased, then grit blasted using 180 grit alumina abrasive powder, and treated with sol using a dip coating.

TABLE 1

Titanium Specimens Prepared For Epoxy Adhesion Performance Testing

| Sample ID | Sample Size (inches) | # of Panels | Test | Surface Treatment | Primer |
|---|---|---|---|---|---|
| GAB01 | 6 × 6 × 0.125 | 4 | Wedge Crack Extension | GTMS/TPOZ | B4 127 |
| GAB02 | 6 × 6 × 0.125 | 4 | Wedge Crack Extension | GTMS/TPOZ | Cytec 6757 |
| GAB03 | 6 × 6 × 0.050 | 2 | Wedge Crack Extension | GTMS/TPOZ | BR 127 |
| GAB04 | 6 × 6 × 0.050 | 2 | Wedge Crack Extension | GTMS/TPOZ | Cytec 6757 |
| GAB05 | 4 × 7 × 0.063 | 12 | Lap Shear, Various Conditions | GTMS/TPOZ | BR 127 |
| GAB06 | 4 × 7 × 0.063 | 8 | Lap Shear, Various Conditions | GTMS/TPOZ | Cytec 6757 |
| GAB07 | finger panels | 6 | Lap Shear, Various Conditions | GTMS/TPOZ | BR 127 |

TABLE 1-continued

Titanium Specimens Prepared For Epoxy Adhesion Performance Testing

| Sample ID | Sample Size (inches) | # of Panels | Test | Surface Treatment | Primer |
|---|---|---|---|---|---|
| GAB08 | finger panels | 6 | Lap Shear, Various Conditions | GTMS/TPOZ | Cytec 6757 |
| GAB010 | 6 × 6 × 0.125 | 4 | Wedge Crack Extension | CAA/5V | BR 127 |
| GAB011 | 6 × 6 × 0.125 | 12 | Lap Shear, Various Conditions | CAA/5V | BR 127 |

The chromic acid anodize (CAA) specimens displayed 100% cohesive failure. The failure modes of the sol-gel panels varied. Panels primed with the solvent-based BR127 tended to show between 10–50% cohesive failure and the remainder adhesive failure at the adherent-sol interface, while the panels primed with the water-based XBR 6757 exhibited from 80–100% cohesive failure.

Figure 10:
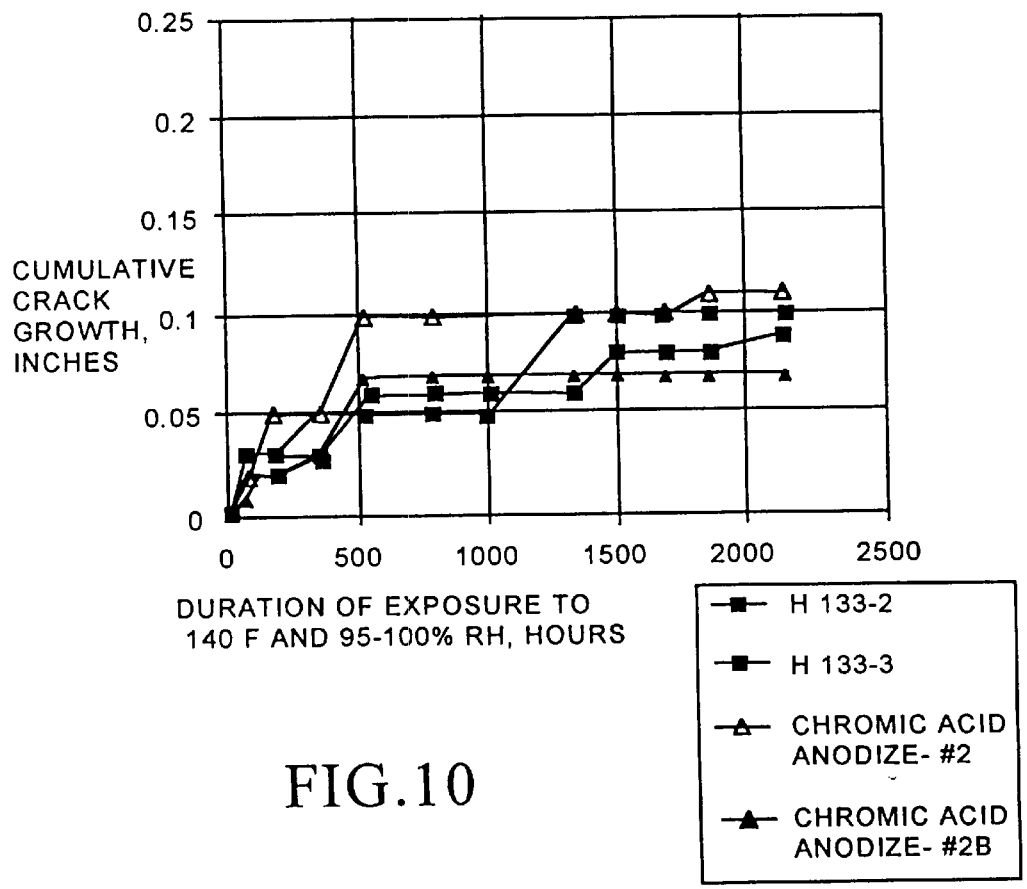
FIG. 10 is a graph showing cumulative crack growth as a function of extended exposure to hot/wet conditions comparing sol-coated metals with chromic acid anodized standards.

The results of crack growth tests during long term exposure to 140° F. condensing humidity are shown in FIG. 10. H133-2 is a sol that had been aged for 1.9 hrs, while H133-3 had aged for 0.2 hrs prior to application. These solutions produced coatings having crack growth comparable with the chromic acid anodize standards even after 2000 hours hot/wet exposure. The crack growth rate had leveled off at approximately 0.1 inches crack extension. Abrupt jumps in the data are due to the difficulty in visually measuring minute changes in the crack extension. Ideally, a smooth curve could be drawn into the raw data representing the growth rate over time. These results show that the hot/wet durability of these water-based sol coatings compares well with the CAA controls.

Lap shear data were collected on an Instron Series IX Automated Materials Testing System 6.04. The sample rate was 9.1 pts/sec with a crosshead speed of 0.05 in/min. Lap shear data is listed in Table 2. Results are an average of five finger test specimens per data point.

TABLE 2

Lap Shear Data

| | CAA Control with Cytec BR 127 | | Boeing SG with Cytec BR 127 | | Boeing SG with Cytec XBR 6767 | |
|---|---|---|---|---|---|---|
| | Ultimate Stress (psi) | Failure Mode (% coh) | Ultimate Stress (psi) | Failure Mode (% coh) | Ultimate Stress (psi) | Failure Mode (% coh) |
| −65° F. Lap Shear | 7988 | 80 | 7900 | 100 | 8822 | 100 |
| RT Lap Shear | 5935 | 100 | 6278 | 100 | 6015 | 100 |
| 180° F. Lap Shear | 3722 | 100 | 4123 | 100 | 3586 | 100 |

The lap shear failure mode is predominantly cohesive within the adhesive layer in all of the specimens at all of the temperatures. The data for the CAA control and the sol-gel surface preparations with both primers was essentially the same within experimental error.

Lap shear coupons produced with a sol that had been aged for 150 hrs or one that had been aged for 338 hrs had essentially the same ultimate stress values. Exposure of the lap shear specimens made with sol in a hot/wet environment resulted in a 14% decrease in ultimate stress after 168 hrs and 27% after 500 hrs. A 500 hour hot/wet exposure of the CAA control specimens resulted in a 7% degradation.

Electronic Spectroscopy for Chemical Analysis (ESCA) studies were conducted on an ethanol-based formulation to determine the mode of failure during hot/wet exposure. The bonding surfaces of two previously tested wedge crack sample coupons were examined using ESCA analysis techniques. The first sample, H83KAK-1, was a grit blasted Ti-6-4 panel which had been coated with an isopropanol solution of 2% GTMS, 1% TPOZ and 1% 80%-acetic acid. It was tested at 120° F. and 95% relative humidity for 864 hours and had an average increase in the initial crack length of 0.45 inches by the end of the test.

The sample was split in half and small mating surface section from adhesively failed areas of the coupon were examined The bare titanium surface of the adhesively failed sample section had high carbon, low titanium and small amounts of silicon and zirconium. As this surface was sputter-etched, the percentages of silicon, zirconium and chromium increased and reached a maximum before dropping off with continued sputtering. After 300 Å of sputter etching, the carbon-content percentage had reached a minimum and the titanium, aluminum and vanadium content percentages had reached a maximum. At this depth, the zirconium percentage was about 20% below its maximum value and the silicon content was more that 50% below its maximum value. Table 3 shows the sputtering data for this system.

TABLE 3

ESCA Sputter Data for Failed Surfaces

| atom | adhesive (sputter) | metal | metal | metal sputter |
|---|---|---|---|---|
| O | 40.97 | 28.23 | 36.88 | 31.52 |
| Ti | | | 2.62 | 22.74 |
| C | 36.89 | 59.61 | 44.36 | 19.06 |
| Al | 4.05 | 2.99 | 6.12 | 14.16 |
| Si | 11.9 | 4.45 | 3.42 | 5.38 |
| Zr | 2.81 | 0.51 | 0.63 | 2.34 |
| Ar | | | | 2.2 |
| N | 1.1 | 0.91 | 0.95 | 1.45 |
| V | | | | 1.15 |
| Cr | 2.29 | 1.43 | 1.82 | |

Aging studies with ESCA suggest that aging the solution does not alter the surface characteristics significantly.

Roughness of the etched titanium surface prevented accurate determination of the thickness of the sol coating. ESCA measures an area of the surface approximately 600 μm in diameter. Table 4 shows the surface composition following various sputter times on the coated sample. The etched titanium surfaces have "craters" approximately 15 μm in diameter and 2–5 μm deep. Therefore, the ESCA experiment will measure about 20 "craters" and associated ridges. The sol coating is likely to be thinner on the ridges than in the craters, perhaps thin enough for the substrate material to have a measurable signal even without sputtering.

The ESCA data for both samples show a small amount of titanium at the surface indicating that some areas of the substrate are not coated or that sol coating on the ridges is thinner than about 130 Å. Argon plasma sputtering the surface gradually removes the sol coating, as indicated by the decrease in Si and Zr, but there is not a sharp change in surface composition. The data are consistent with a surface having roughness greater than the coating thickness.

TABLE 4

ESCA Data for Unexposed Water-based Sol-Gel Specimens

| Atomic % | 24 hr old solution | | | | 1 hr old solution | |
|---|---|---|---|---|---|---|
| | Surface | Light Sputter | 345 Å Sputtered | 430 Å Sputtered | Surface | 430 Å Sputtered |
| Carbon | 44.8 | 19.0 | 5.2 | 5.5 | 57.5 | 23.0 |
| Oxygen | 40.6 | 52.8 | 23.0 | 23.5 | 32.1 | 31.4 |
| Titanium | 3.1 | 9.2 | 51.0 | 54.0 | 2.4 | 31.3 |
| Aluminum | 0.6 | 2.4 | 9.8 | 8.3 | 0.6 | 5.8 |
| Vanadium | — | — | 2.8 | 2.4 | — | 1.7 |
| Zirconium | 2.0 | 3.0 | 0.7 | 1.0 | 0.8 | 0.5 |
| Niobium | 0.5 | 1.0 | 0.3 | — | 0.3 | — |
| Molybdemun | 0.2 | 0.5 | 0.2 | — | 0.2 | — |
| Fluorine | — | 0.8 | — | — | — | — |
| Silicon | 8.1 | 10.8 | — | — | 3.5 | — |
| Nitrogen | — | — | 3.3 | 1.8 | 1.1 | 2.4 |
| Copper | — | — | — | — | 0.3 | 0.3 |
| Calcium | — | — | — | — | 1.2 | 1.2 |
| Argon | — | 0.4 | 3.7 | 3.4 | — | 2.4 |

The theoretical composition of the fully hydrolyzed sol-gel film is 4 parts $SiO_{1.5}Gly$ and 1 parts $ZrO_2$ where Gly is the glycidoxy group attached to the silicon. The (silicon+zirconium):carbon:oxygen ratio for a homogeneous coating formed from this sol is 1:4:4:3.2. The experimental value for the surface of the 24 hr old formulation specimen shows the (silicon+zirconium):carbon:oxygen ratio to be approximately 1:4:5:4.0, very close to the theoretical value. The ratio of (Si+Zr):C:O ratio becomes 1:1.2:3.8. Continued sputtering further reduces the carbon signal to near background levels and the oxygen signal decreases as well. We interpret the data to indicate that the deposited film is not homogeneous. The glycidoxysilane is located primarily on the surface with the coating composition changing to zirconia and titania and finally the metallic substrate. This measured gradient is consistent with our model of formation of films from our sols and observations of increasing water aversion of substrates as coatings are deposited. The thickness of the sol coating is not accurately determined by this measurement but it appears to be a minimum of 100–300 Å. Considering the escape depth of ESCA being about 100 Å, the glycidoxy-rich surface layer is no more than about 75–150 Å thick as indicated by the decrease in the carbon level.

The low carbon level in the coating after 450 Å etch indicates that hydrolysis of the sol is essentially complete within 24 hours. Data for coatings deposited from the same sol aged for only 1 hour show significantly greater amounts of carbon both at the surface and at the 450 Å level. Incomplete hydrolysis will leave alkoxy groups attached to both silicon and zirconium. In addition, acetate groups from the incomplete hydrolysis of the stabilized zirconate will also be incorporated throughout the coating. The ESCA data do not differentiate between acetate, glycidoxy, and alcohol carbon and oxygen.

We conducted experiments using aluminum substrates (alloys 7075 and 2024) similar to those for titanium. FIG. 3 shows the cumulative crack growth or extension as a function of time for an epoxy adhesive. Crack growth was the smallest for a sol coated 7075 alloy. The hot/wet durability of the sol coated specimens was comparable with the phosphoric acid anodized (PAA) controls for 1000 hrs of testing. The sol coated specimens were acceptable as measured by BAC 5555 PAA requirements, so the sol coating is an alternative and improvement to PAA for at least these aluminum alloys.

We collected lap shear data as well for the sol coated 7075 and 2024 alloys. Room temperature (RT) results surpass the minimum threshold specified in BAC 5555. Our tests indicate that specimens primed with a waterbased nonchromated primer (Cytec XBR 6757) performed as well as or better than specimens primed with the conventional chromated, oil-based primer (Cytec BR 127). Again, 7075 alloys had better performance than 2024 alloys. Floating roller peel test data (reported as the average of five individual specimens) showed that sol coated aluminum specimens compared favorably with the bond strengths achieved with conventional PAA controls.

Our studies regarding the method of application (i.e., spraying v. drenching v. dipping) for aluminum substances suggest that the method of application has little effect on the bond strength. This fact makes the sol coating desirable for field repair and depot maintenance because specialized equipment likely is not required to obtain the benefits of sol coating. Also, the data we collected suggests that the coating process is robust rather than a "craft." We also found little effect from drenching versus mist spraying.

Parameters such as concentration, acid catalyst, aging, hydrolysis/concentration, and the ratio of the reactants will need to be optimized for large scale and spray operation. We anticipate that these will be different than those optimized for dipping. The use of surfactants and thixotropic agents in the solution may improve the spray characteristics of the solution, but may adversely affect the bonding performance. These agents may help to provide a more uniform sprayed coating and improve the manufacturability of the process.

There are fundamental differences in the manner of film formation between spraying and dipping. With dipping or immersion coating, the thermodynamically favored products of slower reactions can dominate. With the part immersed in the solution, reactant can reach to the metal surface through mechanical, thermal, and mass transport mechanisms. Reaction products can diffuse away from the surface. The most thermodynamically stable coating will develop. In the case of spraying, only a thin film of the sol contacts the surface. Depletion of reactants can and likely does occur as the sol flows down the surface. Consequently, reaction products build up and may influence the chemistry that occurs. In addition, reaction products remain on the surface when the film dries. The sol-gel film developed with spraying is dominated by kinetically accessible products. Advantages of spraying include coating thickness control and uniformity.

The preferred zirconium compounds for making the sol are of the general formula $(R-O)_4$ Zr wherein R is lower aliphatic having 2–5 carbon atoms, especially normal aliphatic (alkyl) groups, and, preferably, tetra-n-propoxyzirconium, because of its being readily available commercially. We believe that branched aliphatic, alicyclic, or aryl groups would also perform satisfactorily. For applications involving extended exposure to hot/wet conditions, we want the organo moiety on the zirconium to have thermo-oxidative stability.

The preferred organosilane compounds (available from Petrarch or Read) for making the sol are:

3-aminopropyltriethoxysilane,
3-glycidoxypropyltrimetheoxysilane,
p-aminophenylsilane,
allyltrimethoxysilane
n-(2-aminoethyl)-3-aminopropyltrimethoxysilane
3-aminopropyltriethoxysilane
3-aminopropyltrimethoxysilane
3-glycidoxypropyldiisopropylethoxysilane
(3-glycidoxypropyl)methyldiethoxysilane
3-glycidoxypropyltrimethoxysilane
3-mercaptopropyltrimethoxysilane
3-mercaptopropyltriethoxysilane
3-methacryloxypropylmethyldiethoxysilane
3-methacryloxypropylmethyldimethoxysilane
3-methacryloxypropyltrimethoxysilane
n-phenylaminopropyltrimethoxysilane
vinylmethyldiethoxysilane
vinyltriethoxysilane or
vinyltrimethoxysilane.

In these organometallics, the organo moiety preferably is aliphatic or alicyclic, and generally is a lower n-alkoxy moiety having 2–5 carbon atoms. The organosilane includes typically an epoxy group (for bonding to epoxy or urethane resins or adhesives) or a primary amine (for bonding to polyimide resins or adhesives).

If the sols are alcohol-based, the preferred alcohols are ethanol, isopropanol, or another lower aliphatic alcohol.

The sols can be used to make sol-gel films on the following aluminum and titanium alloys: Al 2024; Al 7075; Ti-6-4; Ti-15-3-3-3; Ti-6-2-2-2-2; and Ti-3-2.5. The sol coating method can also be used with copper or ferrous substrates, including stainless steel or an Inconel alloy.

3. Hybrid Laminates

Sol coated metals are useful in hybrid laminates like those described in U.S. Pat. No. 4,489,123 or U.S. Pat. No. 5,866,272. These hybrid laminates are candidates for use as aircraft skin panels and other structural applications in subsonic or, especially, supersonic aircraft. The utility of these hybrid laminates hinges on a sound, strong adhesive bond between the metal and resin. The sol coating of the present invention provides a high strength adhesion interface at relatively low cost compared with conventional alternatives in a reasonably simple manufacturing process.

Hybrid laminates should have a high modulus (absolute strength) and be fatigue resistant so that they have long life. They should exhibit thermomechanical and thermo-oxidative stability, especially in hot/wet conditions. They should have a high strength-to-weight ratio while having a relatively low density as compared to a solid (monolithic) metal. They should be damage resistant and damage tolerant, but they should dent like metal to visibly show damaged areas long before the damage results in actual failure of the part. They should be resistant to jet fuel and aerospace solvents. Finally, they should be resistant to crack growth, preferably slower than monolithic titanium.

Figure 11:
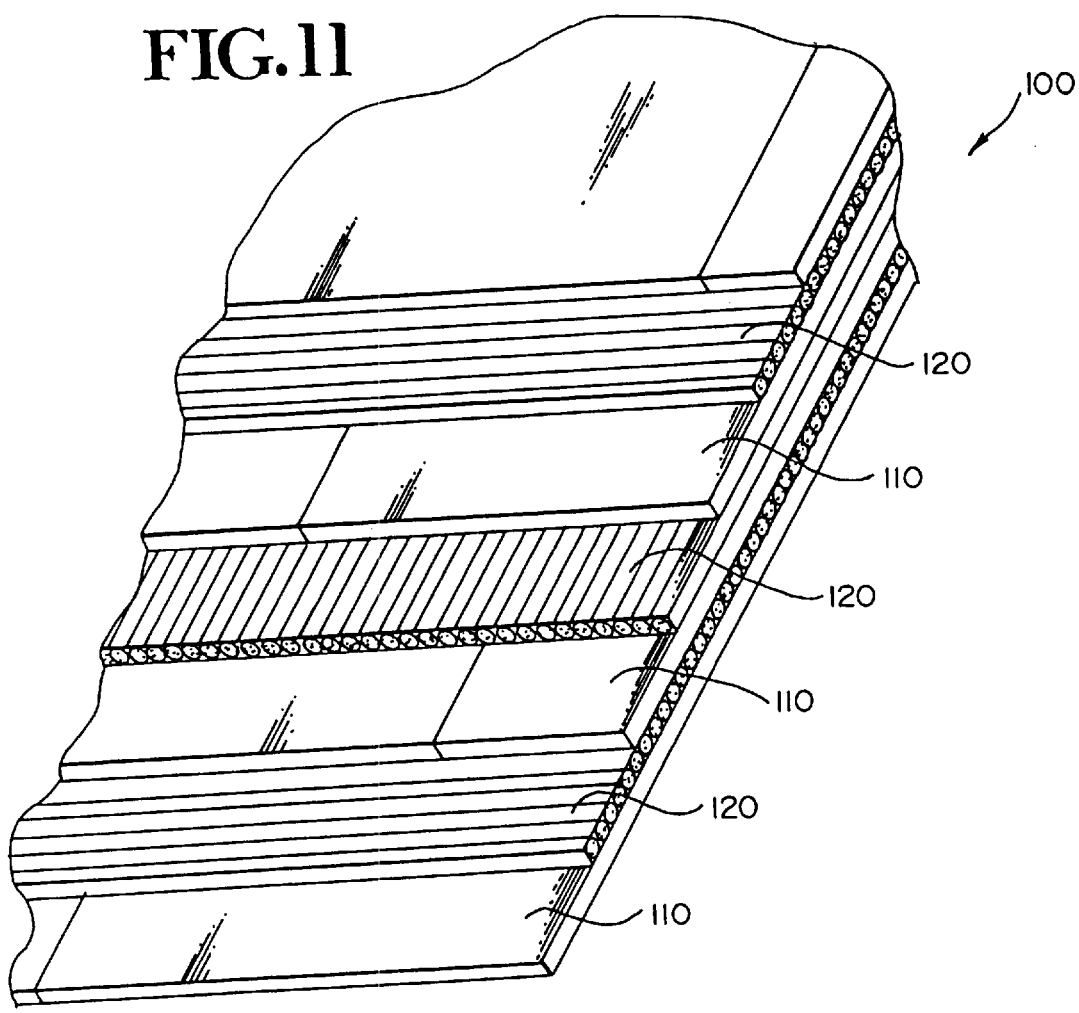
FIG. 11 is an isometric view of a typical hybrid laminate.

The hybrid laminates generally have alternating layers of titanium alloy foil 110 and a fiber-reinforced organic matrix composite 120 (FIG. 11). The foil typically is sol coated in accordance with the method of the present invention to enhance adhesion between the foil and the matrix resin of the composite (and any intervening primers or adhesives). The sol coating may also provide corrosion resistance to the titanium. The foil typically is about 0.01–0.003 inches thick (3–10 mils) of β-annealed titanium alloy having a yield strain of greater than about 1%. The composite typically is a polyimide reinforced with high strength carbon fibers. The polyimide is an advanced thermoplastic or thermosetting resin capable of extended exposure to elevated temperatures in excess of 350° F., such as BMI, PETI-5, or a Lubowitz and Sheppard polyimide. The composite is one or more plies to provide a thickness between the adjacent foils of about 0.005–0.03 inches (5–30 mils). Other configurations of the hybrid laminates, like metal reinforced resin composites, might be used.

The preferred composite is formed from a prepreg in the form of a tow, tape, or woven fabric of continuous, reinforcing fibers coated with a resin to form a continuous strip. Typically, we use a unidirectional tape. The fibers make up from about 50 to 70 volume percent of the resin and fibers when the fiber is carbon, and from about 40 to about 60 volume percent when the fiber is boron. When a mixture of carbon and boron fibers is used, total fiber volume is in the range 75 to 80 volume percent. The plies may be oriented to adjust the properties of the resulting composite, such as 0°/90° or 0°/−45°/+45°/0°, or the like.

Hybrid laminates of this type exhibit high open-hole tensile strength and high compressive strength, thereby facilitating mechanical joining of adjacent parts in the aircraft structure through fasteners. The laminates might also include Z-pin reinforcement in the composite layers or through the entire thickness of the laminate. Z-pinning techniques are described in U.S. patent application Ser. Nos. 08/582,297 or 08/658,927 or U.S. Pat. Nos. 5,862,975; 5,736,222; or 5,869,165, which we incorporate by reference.

Figure 12:
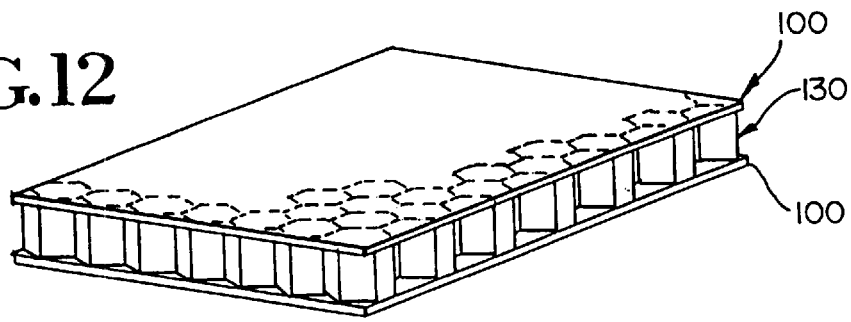
FIG. 12 is an isometric view of a sandwich panel having hybrid laminate skins and a honeycomb core as typically used in an aerospace skin panel.

The hybrid laminates can be used in skin panels on fuselage sections, wing sections, strakes, vertical and horizontal stabilizers, and the like. The laminates are generally bonded as the skins 100 of sandwich panels that preferably are symmetrical and include a central core 130 of titanium alloy honeycomb, phenolic honeycomb, paper honeycomb, or the like (FIG. 12), depending on the desired application of sandwich panel. Sandwich panels are a low density (light weight), high strength, high modulus, tailorable structure that has exceptional fatigue resistance and excellent thermal-mechanical endurance properties.

The hybrid laminates are also resistant to zone 1 lightning strikes because of the outer titanium foil.

Outer metal layers protect the underlying composite from the most severe hot/wet conditions and the cleaning solvents that will be experienced during the service life of the product, especially if it is used on supersonic aircraft.

To prepare the hybrid laminates, generally we pretreat cleaned, β-annealed Ti-6Al-4V alloy foils in various concentrations (i.e. 20%, 60%, or 80%) of TURCO 5578 alkaline etchant (supplied by Atochem, Inc. of Westminster, Calif.). After water rinsing the foils are immersed in 35 vol % $HNO_3$—HF etchant at 140° F. to desmut the foil, they are rinsed again, and, then, are sol coated in accordance with the present invention.

For the strongest interaction between the sol-gel film and the composite, We prefer that the organic moiety of the silane correspond with the characteristics of the resin. For example, PETI-5 is a PMR-type or preimidized, relatively low molecular weight resin prepreg having terminal or pendant phenylethynyl groups to promote crosslinking and chain extension during resin cure. Therefore, the silane coupling group might include a reactive functionality, such as an active primary amine; an anhydride, carboxylic acid, or an equivalent; or even a phenylethynyl group, to promote covalent bonding between the sol coating and the resin. The organic moiety might simply be an aliphatic lower alkyl moiety to provide a resin-philic surface to which the resin will wet or have affinity for to provide adhesion without producing covalent bonds between the organosilane coupling agent and the resin. The aliphatic moiety, however, would still provide hydrogen atoms for hydrogen bonding with the numerous heteroatoms (oxygen) in the cured PETI-5 imide. If the resin includes a nadic or maleic crosslinking functionality, as Lubowitz and Shepard suggest or as occurs in bismaleimides, then the organosilane coupling agent might include the same nadic or maleic crosslinking functionality or an amine, —OH, or —SH terminal group for covalent bonding through capping extension or the Michael's addition across the active unsaturated carbon-carbon bond in the resin's cap. For higher temperature applications, we recommend using an aromatic organometallics since these compounds should have higher thermo-oxidative stability.

Greater covalent interaction between the resin and sol-gel film is likely to occur if the resin is a PMR formulation at the time of layup onto the foil rather than a fully imidized resin of relatively high formula weight, such as Lubowitz and Sheppard propose. Of course, PMR formulations have their processing limitations. Knowing which resin approach will provide the best overall performance in the hybrid laminates remains for further testing, as does selection of the absolute type of resin and its formulation. Ideally, the resin is easy to process because it has few adverse aging consequences from extended exposure to ambient conditions common during fiber placement. The resin prepregs should also have long shelf lives. Alternately, the resin should be suitable for in situ consolidation while being placed on the foil.

Tows of mixed carbon and boron fibers suitable for these hybrid laminates are sold under the tradename HYBOR by Textron Specialty Materials of Lowell, Mass. Boron fibers provide high compressive strength, while carbon fibers provide high tensile strength. The preferred boron fiber has the smallest diameter (typically 4–7 mils) and the highest tensile elongation.

Hybrid laminates can have open-hole tensile strengths of about 150–350 ksi and an ultimate tensile strength in excess of $2 \times 10^6$ psi/lb/in$^3$.

4. Paint Adhesion

Figure 13:
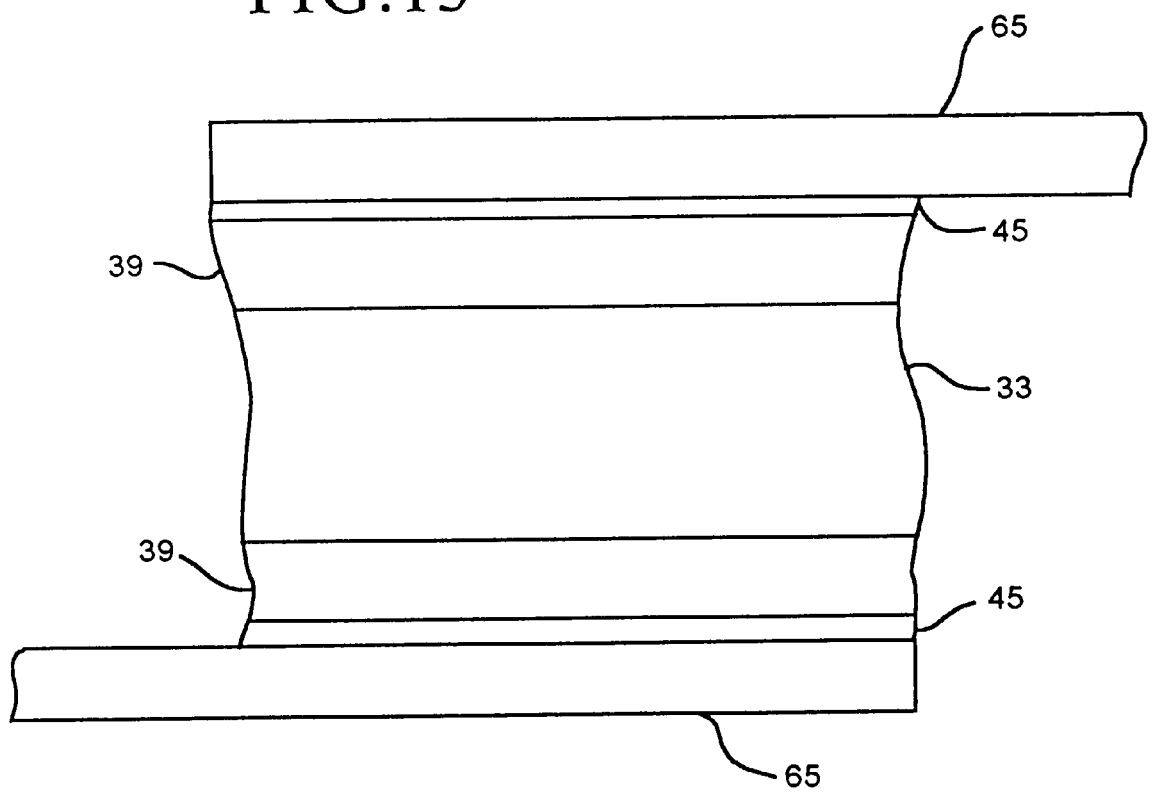
FIG. 13 is a sectional view showing the typical layers in a sol coated metal product, here illustrated as a lap joint having an adhesive bond.
Figure 14:
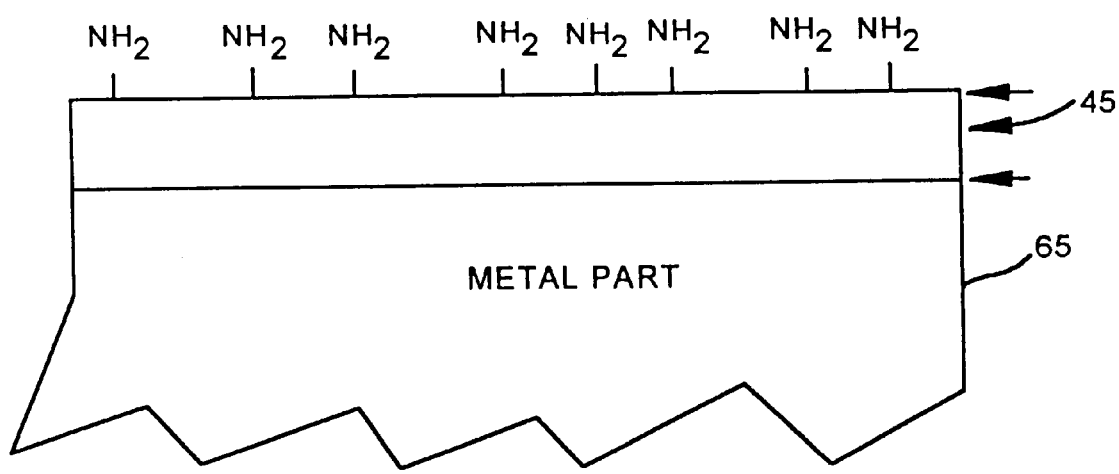
FIG. 14 is a schematic sectional view of the sol coating.

A sol coating is particularly useful as an adherent for surface coatings (paints), especially urethane coatings, that are common in aerospace applications. Essentially the same aspects that make the sol coatings advantageous for hybrid laminates make them advantageous for paint adhesion. They convert the metal surface into a surface with high affinity for the paint binder. They preferably include components that covalently bond to the metal substrate as well as to the paint binder. In this application, rather than applying on adhesive 33 (FIG. 13) over the primer 39, we apply the exterior surface coating or paint 55 (FIG. 15) typically pigments carried in a urethane binder. The sol coating provides long lasting durability for adherence of the primer and finish coating to the metal.

Figure 15:
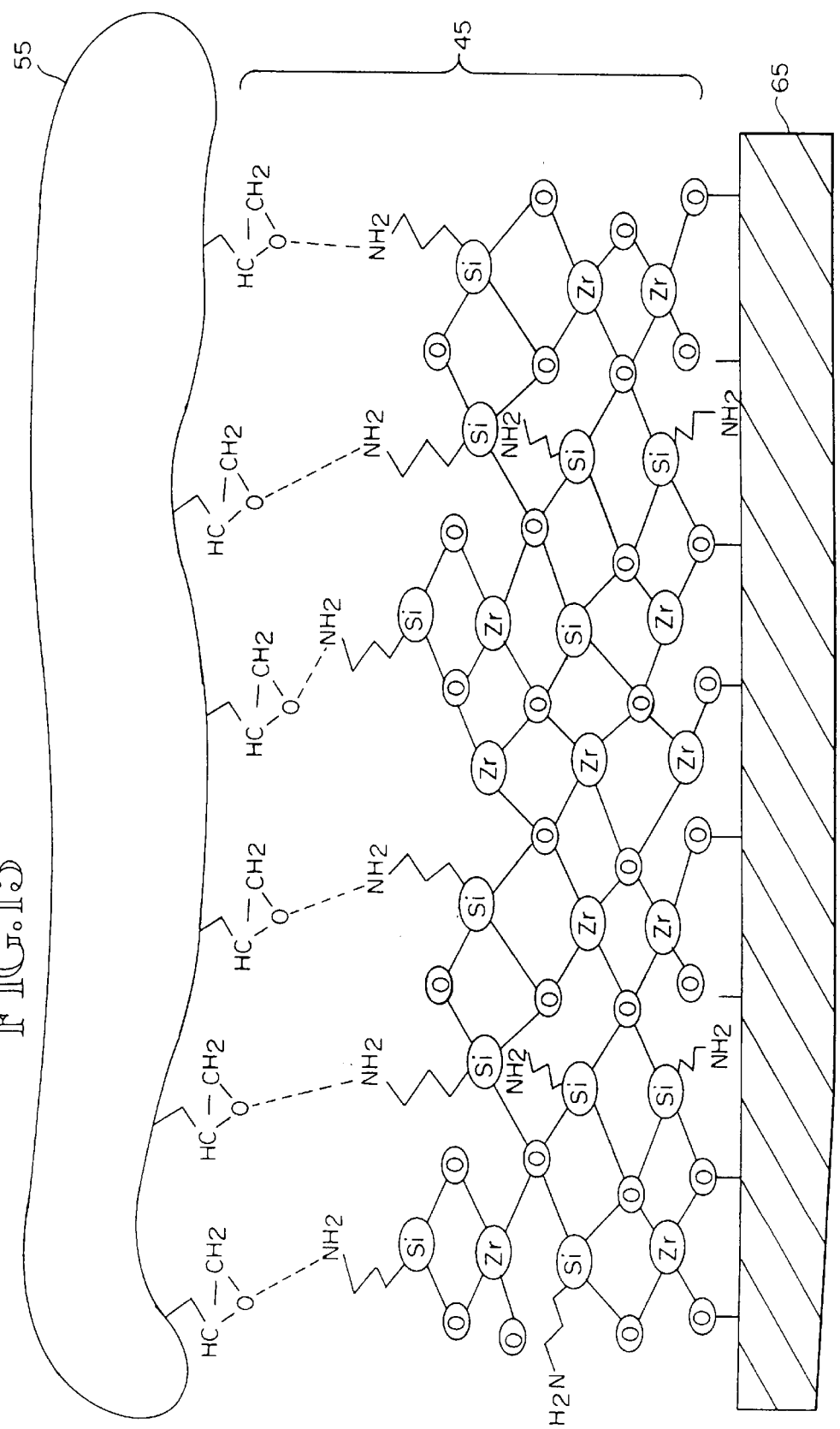
FIG. 15 is another schematic sectional view of the sol coating for paint adhesion showing the interfaces at the metal and resin interfaces and the peptizing within the sol coating between the Zr and Si.

The sol coating of the present invention promises to improve paint adhesion and to simplify field repair and maintenance of painted metal surfaces, especially titanium or aluminum structure painted with epoxy or urethane paints. Because the sol has essentially a neutral pH, it can be easily used in the field for touch up without the precautions or special equipment necessary for andozing. Through the sol coating 45, the paint 55 is essentially covalently bonded to the metal 65 as shown in FIG. 15 and adhesion is significantly enhanced. We obtain improved adhesion even for parts that have had acid surface etching several weeks prior to priming and painting.

The preferred sol coating process for paint adhesion improvement involves:

(a) cleaning the surface with an aqueous detergent or another cleaning solvent.

(b) welting the surface for at least five (5) min prior to applying the sol;

(c) applying the sol by spraying or another suitable means while continuing to keep the surface wet for 1–2 min;

(d) drying the sol to form a sol coating at ambient conditions for 15–60 min;

(e) heating the sol coating to a temperature in the range from 160–250° F. (preferably, 230±20° F.) for 15–45 min to complete the drying; and (f) applying the primer or paint, as appropriate, between 2–72 hours after completing drying steps (a) & (e).

The sol has a pot life of up to about ten hours. Of course, there is an induction time following mixing that reduces the period of time in which the sol can be applied.

We achieve the most consistent results using deionized water as the carrier or solvent. The deionized water should have a minimum resistivity of about 0.2 MΩ.

The sol might also be used as a coupling agent in polyimide resin composite bonds (especially BMI or KIIIB composites) to other resin composite parts or to metals.

The sol coating can be applied to advantage on sheet, plate, foil, or honeycomb. While described primarily with reference to Ti, the sol coating is also useful on Al, Cu, or Fe pure metals or alloys. One application for copper includes coating a susceptor mesh or foil used in thermoplastically welded composite structures. Another application for coated copper includes protecting the metallic interlayers in multichip modules or multilayer chip module packaging. Suitable ferrous alloys are mild steel, cold rolled steel, stainless steel, or high temperature alloys, such as the nickel-iron alloys in the INCONEL family.

To prepare the sol according to the mixing procedure outlined in Table 5. The absolute volume mixed can vary as needed. Once mixed the sol should age for 4–6 hours to reach equilibrium.

TABLE 5

Sol Preparation for Amino-based Silanes

| Step | | |
|---|---|---|
| * | Stir 500 ml deionized (DI) water into 1000 ml flask | Flask 1 (1000 ml) |
| * | Add 4 Drops NH$_4$OH | |
| * | Verify pH around 7–8 (add more if appropriate) | |
| * | Add 7.3 ml glacial acetic acid (GAA) to 50 ml flask | Flask 2 (50 ml) |

TABLE 5-continued

Sol Preparation for Amino-based Silanes

| Step | |
|---|---|
| * Add 10 ML TPOZ into 50 ml flask with GAA | |
| * Shake mixture | |
| * Add 34 ml organosilane to 1000 ml flask, avoid drops on sides of flask | Flask 1 (1000 ml) |
| * Cover flask | |
| * Dwell for 20 to 30 minutes | |
| * Add about 300 ml DI to 500 ml flask | Flask 3 (500 ml) |
| * Add about 200 ml DI to 200 ml flask | Flask 4 (200 ml) |
| * Dilute contents of 50 ml flask with equivalent volume of DI water | Flask 2 (50 ml) |
| * Add entire contents of 50 ml flask to 500 ml flask (should be clear) | Flask 2 (50 ml) + Flask 3 (500 ml) |
| * Add 3 ml of NH$_4$OH, squirt in while agitating violently pH should be about 5 (milky white) | |
| * Add contents of 500 ml flask to 100 ml flask | Flask 3 (500 ml) + Flask 1 (1000 ml) |
| * rinse 500 and 50 ml flasks with DI water from 200 ml flask (H between 8–9) into 1000 ml flask | Flask 1 (1000 ml), Flask 2 (50 ml) |
| | Flask 3 (500 ml), Flask 4 (200 ml) |
| * Allow solution to age for 4–6 hours under constant agitation prior to application | |

A presently preferred surface pretreatment for the metal (albeit one different from that schematically illustrated in FIG. 1) includes the steps outlined in Table 6.

TABLE 6

Surface Treatments

| Pretreatment Process Steps | Temp | Time |
|---|---|---|
| Aqueous Degrease with Super Bee per BAC 5763 (optional) | 150 ± 5 F. | 20 to 30 minutes |
| Water immersion rinse (optional) | 100 ± 15 F. | 3 to 5 minutes |
| Alkaline Clean Brulin 815 GD per BAC 5749 | 140 ± 5 F. | 20 to 40 minutes |
| Water immersion rinse | 100 ± 15 F. | 3 to 5 minutes |
| Water Spray Rinse | Ambient | NA |
| Turco 5578 Alkaline Etch (80% concentration) | 190 ± 5 F. | 15 to 20 minutes |
| DI Water Immersion Rinse | Ambient | 3 to 5 minutes |
| HNO$_3$ Desmut (35% concentration) | 150 ± 5 F. | 3 to 4 minutes |
| DI Water Immersion Rinse with Agitation | Ambient | 3 to 5 minutes |
| DI Water Spray Rinse | Ambient | NA |

Verify parts are water break free for greater than 60 seconds

BOECLENE desmutting can replace the HNO$_3$. The composition and use of BOECLENE is described in U.S. Pat. No. 4,614,607, which we incorporate by reference.

While we have described preferred embodiments, those skilled in the art will readily recognize alternatives, variations, and modifications which might be made without departing from the inventive concept. Therefore, interpret the claims liberally with the support of the full range of equivalents known to those of ordinary skill based upon this description. The examples illustrate the invention and are not intended to limit it. Accordingly, define the invention with the claims and limit the claims only as necessary in view of the pertinent prior art.

We claim:

1. A hybrid laminate, comprising:
   a) at least one sol-coated metal foil, the foil having opposed faces, the sol providing a stable oxide layer on each face to provide corrosion resistance for the foil and adhesion enhancement between the foil and a matrix resin, and;
   b) a fiber-reinforced organic matrix resin adhered to the stable oxide layer on each surface of the sol-coated metal foil,
   the sol being a mixed metal Zr—Si sol in an aqueous carrier,
   the foil being a β-annealed titanium alloy.

2. The hybrid laminate of claim 1 wherein the metal is titanium or a titanium alloy and the fiber reinforcement is carbon fiber.

3. The hybrid laminate of claim 2 wherein the sol coating contains another organometallic compound, the compound having a functionality for covalently bonding with the organic matrix resin.

4. A hybrid laminate, comprising:
   a) at least one sol-coated metal foil, the foil having opposed faces, the sol providing a stable oxide layer on each face to provide corrosion resistance for the foil and adhesion enhancement between the foil and a matrix resin, and;
   b) a fiber-reinforced organic matrix resin adhered to the stable oxide layer on each surface of the sol-coated metal foil,
   the sol being a mixed metal Zr—Si sol in an aqueous carrier
   wherein the metal is titanium or a titanium alloy and the fiber reinforcement is carbon fiber, and
   wherein the organic matrix resin is a polyimide.

5. The laminate of claim 4 wherein the sol includes an organosilane adapted for covalently bonding with the matrix resin and about 1 vol % organozirconium based on the total sol volume, the organozirconium being capable of covalent bonding with the metal.

6. The laminate of claim 5 wherein the organosilane includes a functional organic moiety for covalently bonding to the organic matrix resin.

7. The hybrid laminate of claim 4 wherein the sol coating contains an organozirconium having the zirconium functionality covalently bonded to the titanium or titanium alloy.

8. The hybrid laminate of claim 4 wherein the ratio of organozirconium to organosilane is about one part organozirconium to two parts organosilane by volume.

9. The hybrid laminate of claim 8 wherein the sol coating is sufficiently thin to avoid the coating being glassy.

10. They hybrid laminate of claim 8 wherein the sol coating is about 20–500 nm thick.

11. The hybrid laminate of claim 10 wherein the organozirconium is a propoxyzirconium and the organosilane is 3-glycidoxypropyltrimethoxysilane.

12. In a hybrid laminate having alternating layers of a β-annealed titanium alloy foil and a fiber-reinforced organic matrix resin, the improvement comprising;
   (a) covalently bonding a sol-gel to the metal foil through a metallic functionality on at least one organometallic compound in the sol-gel; and
   (b) covalently bonding the sol-gel to the resin through an organic functionality on a resin-philic organometallic compound in the sol-gel.

13. The hybrid laminate of claim 12 wherein the organometallic compound and the resin-philic organometallic compound are the same compound.

14. The hybrid laminate of claim 12 wherein the organometallic compound and the resin-philic compound are different compounds and wherein the different compounds include different metallic moieties.

15. The hybrid laminate of claim 12 having at least five layers in the arrangement: metal foil-resin-metal foil-resin-metal foil wherein each layer of resin includes fiber reinforcement wherein the fibers in the resin layers have a different orientation.

16. The hybrid laminate of claim 12 wherein the resin includes a polyimide or an epoxy, the fibers include carbon fibers, and the sol-gel is made from an aqueous sol containing about 1 vol % $[R—O]_4$—Zr wherein R is $C_2$–$C_5$ alkyl, alicyclic, or aryl and about 2.0–3.4 vol % organosilane.

17. An adhesively bonded assembly, comprising:
   (a) at least two parts aligned to define a bond line;
   (b) a sol-gel film on the face of each part in registration with the bond line, the film comprising a mixture of an organozirconium and organosilane in the ratio of about one part organozirconium to two parts organosilane by volume;
   (c) a carbon fiber reinforced adhesive connecting the parts along the bond line while interfacing with the sol-gel film.

18. An adhesively bonded assembly, comprising:
   (a) at least two parts aligned to define a bond line;
   (b) a sol-gel film on the face of each part in registration with the bond line, the sol-gel film comprising a mixture of an organozirconium and organosilane, the organosilane including a reactive organic functionality, the organozirconium being stabilized with an effective amount of acetic acid to reduce the rate of hydrolysis of the organozirconium and to catalyze the organosilane, the organozirconium and the organosilane being substantially in the ratio of about 1 part organozirconium to about 2.0–3.4 parts organosilane by volume;
   (c) an adhesive connecting the parts along the bond line to form the adhesively bonded assembly, the adhesive interfacing with the sol-gel film and having a reactive functionality for covalently bonding with the reactive functionality of the organosilane, wherein the parts are made from β-annealed titanium alloy.

19. The assembly of claim 18 wherein the organosilane is a glycidoxyalkoxysilane or an aminoalkoxysilane.

20. The assembly of claim 19 wherein the organozirconium is $\{R—O\}_4Zr$ wherein R is $C_2$–$C_5$ alkyl, alicyclic, or aryl.

21. The assembly of claim 20 wherein the coating includes sufficient base to counter the Zr-acetate complex that forms if the base is absent.

22. The assembly of claim 19 wherein the part is metal, the Zr is covalently bonded to the part and the adhesive is an imide or an epoxy.

23. A titanium hybrid laminate, comprising:
   a) a titanium foil coated with at least one Zr—Si mixed metal, aqueous sol, the sol providing a stable oxide surface on the foil for corrosion resistance and adhesion enhancement, and;
   b) an epoxy or polyimide resin adhered to the stable oxide surface of the foil, wherein the Zr moiety in the sol covalently bonds with the titanium while the Si moiety in the sol covalently bonds with the resin.

24. The hybrid laminate of claim 23 wherein the resin is a polyimide including reinforcing carbon fibers and wherein the Zr—Si mixed metal sol includes an organozirconium compound of the formula $\{R—O\}_4$—Zr wherein R is $C_2$–$C_5$ alkyl, alicyclic, or aryl and an organosilane.

25. The hybrid laminate of claim 24 having at least five layers in the arrangement: metal foil-resin-metal foil-resin-metal foil wherein fibers in the resin layers have a different orientation relative to one another.

26. The hybrid laminate of claim 24 wherein the ratio of organozirconium to organosilane is about 1:2.0–3.4 by volume.

* * * * *

UNITED STATES PATENT AND TRADEMARK OFFICE
CERTIFICATE OF CORRECTION

PATENT NO : 5,958,578

DATED : September 28, 1999

INVENTOR : K. Blohowiak *et al.*

It is certified that error appears in the above-identified patent and that the Letters Patent is corrected as shown below:

At column 1, line 4, please insert:

-- <u>NOTICE OF GOVERNMENT RIGHTS</u>

-- This invention was made with Government support under Contract F33615-93-C-5322 awarded by the Air Force. The Government has certain rights in this invention. --

Signed and Sealed this

Twenty-seventh Day of March, 2001

*Attest:*

NICHOLAS P. GODICI

*Attesting Officer*  *Acting Director of the United States Patent and Trademark Office*